(12) United States Patent
Usui et al.

(10) Patent No.: US 10,403,667 B2
(45) Date of Patent: Sep. 3, 2019

(54) PHOTOELECTRIC CONVERSION DEVICE AND MANUFACTURING METHOD OF THE SAME HAVING WAVEGUIDE INCLINED SIDE FACE WITH IMPROVED SENSITIVITY BY INCREASING REFLECTION RATE OF LIGHT REACHING SIDE FACE NEAR INCIDENT FACE OR ENTRANCE FACE OF WAVEGUIDE

(71) Applicant: CANON KABUSHIKI KAISHA, Tokyo (JP)

(72) Inventors: Takashi Usui, Ashigarakami-gun (JP); Keita Torii, Yamato (JP); Yusuke Onuki, Fujisawa (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 106 days.

(21) Appl. No.: 15/636,378

(22) Filed: Jun. 28, 2017

(65) Prior Publication Data

US 2018/0012921 A1 Jan. 11, 2018

(30) Foreign Application Priority Data

Jul. 6, 2016 (JP) .................................. 2016-134446

(51) Int. Cl.
*H01L 27/146* (2006.01)
*G05D 1/02* (2006.01)

(52) U.S. Cl.
CPC ..... *H01L 27/14625* (2013.01); *G05D 1/0246* (2013.01); *H01L 27/14603* (2013.01); *H01L 27/14629* (2013.01); *H01L 27/14685* (2013.01); *H01L 27/14612* (2013.01); *H01L 27/14621* (2013.01); *H01L 27/14623* (2013.01); *H01L 27/14627* (2013.01); *H01L 27/14636* (2013.01); *H01L 27/14643* (2013.01)

(58) Field of Classification Search
None
See application file for complete search history.

(56) References Cited

U.S. PATENT DOCUMENTS

2006/0124833 A1* 6/2006 Toda ................. H01L 27/14621
250/214 R
2007/0145246 A1 6/2007 Roy et al.
(Continued)

FOREIGN PATENT DOCUMENTS

EP 1793247 A1 6/2007
JP H06112513 A 4/1994
(Continued)

*Primary Examiner* — Idowu O Osifade
(74) *Attorney, Agent, or Firm* — Canon U.S.A., Inc. IP Division

(57) ABSTRACT

A photoelectric conversion device includes a waveguide member disposed above a photoelectric conversion unit, and an insulating member disposed above a substrate, and surrounding at least part of the waveguide member. The waveguide member has a first side face, a second side face, and a third side face, arranged in that order from the substrate. An angle of inclination of the first side face is smaller than an angle of inclination of the second side face. An angle of inclination of the third side face is smaller than the angle of inclination of the second side face. The angle of inclination of the second side face is smaller than 90 degrees.

38 Claims, 13 Drawing Sheets

(56) References Cited

U.S. PATENT DOCUMENTS

| | | | |
|---|---|---|---|
| 2008/0246107 A1* | 10/2008 | Maehara | H01L 27/1462 257/432 |
| 2009/0166518 A1 | 7/2009 | Tay | |
| 2010/0123811 A1 | 5/2010 | Abe | |
| 2011/0089514 A1 | 4/2011 | Tay | |
| 2012/0049305 A1 | 3/2012 | Takami | |
| 2013/0314576 A1 | 11/2013 | Suzuki | |
| 2015/0001661 A1 | 1/2015 | Tomita | |

FOREIGN PATENT DOCUMENTS

| | | |
|---|---|---|
| JP | 2007194606 A | 8/2007 |
| JP | 2010141280 A | 6/2010 |
| JP | 2013247246 A | 12/2013 |
| TW | 201214689 A | 4/2012 |

\* cited by examiner

PHOTOELECTRIC CONVERSION DEVICE AND MANUFACTURING METHOD OF THE SAME HAVING WAVEGUIDE INCLINED SIDE FACE WITH IMPROVED SENSITIVITY BY INCREASING REFLECTION RATE OF LIGHT REACHING SIDE FACE NEAR INCIDENT FACE OR ENTRANCE FACE OF WAVEGUIDE

BACKGROUND OF THE INVENTION

Field of the Invention

The present invention relates to a photoelectric conversion device, an imaging, system, a movable apparatus, and a manufacturing method of the photoelectric conversion device.

Description of the Related Art

A photoelectric conversion device described in Japanese Patent Laid-Open No. 2007-194606 (hereinafter, "PTL 1") has a photoelectric conversion unit, and a waveguide disposed above the photoelectric conversion unit. As to the waveguide described in PTL 1, the sectional area of the waveguide parallel to light receiving surface of the photoelectric conversion unit increases as the distance from the light receiving surface increases, and moreover, the increase rate thereof continuously increases. This means that the inclination of the side face of the waveguide increases more the further away from the light receiving surface. This configuration enables the incident face of the waveguide to be increased, thereby improving sensitivity.

SUMMARY OF THE INVENTION

A photoelectric conversion device according to an aspect of the present disclosure includes: a photoelectric conversion unit disposed in a substrate; a waveguide member disposed above the photoelectric conversion unit; and an insulating member disposed above the substrate, and surrounding at least part of the waveguide member. The waveguide member has a first side face, a second side face, and a third side face, arranged in that order from the substrate. An angle of inclination of the second side face is smaller than 90 degrees. An angle of inclination of the first side face is smaller than the angle of inclination of the second side face. An angle of inclination of the third side face is smaller than the angle of inclination of the second side face.

A photoelectric conversion device according to another aspect of the present disclosure includes: a photoelectric conversion unit disposed in a substrate; an insulating member disposed above the substrate, and having an opening at a position corresponding to the photoelectric conversion unit; and a waveguide member disposed above the photoelectric conversion unit and within the opening. The opening has a first side face, a second side face, and a third side face, arranged in that order from the substrate. An angle of inclination of the second side face is smaller than 90 degrees. An angle of inclination of the first side face is smaller than the angle of inclination of the second side face. An angle of inclination of the third side face is smaller than the angle of inclination of the second side face.

A manufacturing method of a photoelectric conversion device includes: forming an insulating member including a first insulating film, a second insulating film and a third insulating film, which are arranged on a substrate including a photoelectric conversion unit in that order from the substrate; forming an opening in the insulating member, at a position corresponding to the photoelectric conversion unit; and forming a waveguide member in the opening. An angle of inclination of a first side face provided by the first insulating film is smaller than an angle of inclination of a second side face provided by the second insulating film. An angle of inclination of third side face provided by the third insulating film is smaller than the angle of inclination of the second side face. The angle of inclination of the second side face is smaller than 90 degrees.

Further features of the present invention will become apparent from the following description of exemplary embodiments with reference to the attached drawings.

DESCRIPTION OF THE EMBODIMENTS

Figure 1A:
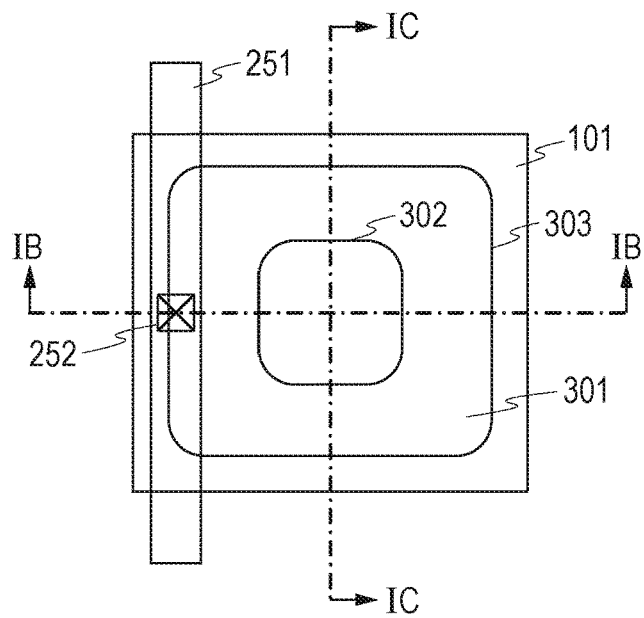
FIGS. 1A through 1C schematically illustrate a photoelectric conversion device, FIG. 1A illustrating a planar configuration of the photoelectric conversion device and FIGS. 1B and 1C illustrating section structures of the photoelectric conversion device.

According to some embodiments according to the present disclosure, the sensitivity of a photoelectric conversion device can be improved. The Present Inventors have found that there is room for further improvement in sensitivity with regard to the waveguide described in PTL 1. As a result of study, the Present Inventors have gained knowledge that sensitivity of a waveguide having an inclined side face can be further improved by increasing the reflection rate (reflectivity, reflection efficiency, or reflection ratio) of light reaching the side face of the waveguide near the incident face, or the entrance face, of the waveguide.

According to the disclosure in PTL 1, the angle of inclination is small at the side face of the waveguide at the portion near the light receiving face of the photoelectric conversion unit, i.e., the angle of inclination is nearly vertical to the light receiving face. On the other hand, the angle of inclination is great at the side face of the waveguide at the portion near the light incident face of the photoelectric conversion unit, i.e., the angle of inclination is nearly horizontal to the light receiving face. Accordingly, there is a possibility that incident light does not reflect at the side face of the waveguide near the incident face. As a result, light may leak from the waveguide, and sensitivity may deteriorate.

One embodiment according to the present disclosure is a photoelectric conversion device. The photoelectric conversion device has photoelectric conversion unit disposed in a substrate, and a waveguide disposed above the photoelectric conversion unit. The photoelectric conversion device further has an insulating member disposed upon the substrate. The insulating member surrounds at least part of a waveguide member forming, or making up, the waveguide. For example, an opening is provided in the insulating member, at a position corresponding to the photoelectric conversion unit. The waveguide is disposed within this opening. In this configuration, the waveguide guides incident light to the photoelectric conversion unit, and the photoelectric conversion unit converts incident light into charges.

The waveguide of the photoelectric conversion device according to this embodiment includes at least a first side face, a second side face, and a third side face. The first side face, second side face, and third side face are arranged, or arrayed, in that order from the substrate. The first side face, second side face, and third side face are each inclined. The angle of inclination of the first side face is smaller than the angle of inclination of the second side face. The angle of inclination of the third side face is smaller than the angle of inclination of the second side face. The side faces of the waveguide are, for example, interfaces where the waveguide member and insulating member come into contact. Alternatively, the side faces of the waveguide are, for example, interfaces where the waveguide member and a metallic reflecting member come into contact. Alternatively, in a case where there is a gap around the waveguide, the side faces of the waveguide are, for example, faces of the waveguide material exposed to the gap.

From another perspective of the embodiment, the opening provided to the insulating member include at least a first side face, a second side face, and a third side face. The first side face, second side face, and third side face are arranged, or arrayed, in that order from the substrate. The first side face, second side face, and third side face are each inclined. The angle of inclination of the first side face is smaller than the angle of inclination of the second side face. The angle of inclination of the third side face is smaller than the angle of inclination of the second side face. Hereinafter, the description regarding the side faces of the waveguide are also applied to the side faces of the opening of the insulating member, unless specifically stated otherwise.

In the Present Specification, the term "angle of inclination" of a certain face means an angle formed between the certain face and a perpendicular to the light receiving face of the photoelectric conversion unit, when viewed at a cross-section intersecting the certain face and including the perpendicular. Note however, that the angle of inclination is defined in a range of 90 degrees or smaller. For example, in a case where a certain face is vertical to the light receiving face of the photoelectric conversion unit, the angle of inclination of this face is 0 degrees. On the other hand, in a case where a certain face is horizontal to the light receiving face of the photoelectric conversion unit, the angle of inclination of this face is 90 degrees. That is to say, the closer the side faces of the waveguide are to be vertical as to the light receiving face of the photoelectric conversion unit, the smaller the angle of inclination of the side faces are. The closer the side faces of the waveguide are to be horizontal as to the light receiving face of the photoelectric conversion unit, the greater the angle of inclination of the side faces are. When the Present Specification states that a certain face is inclined, it means that the certain face has an angle of inclination that is greater than 0 degrees. In other words, a face vertical to the light receiving face of the photoelectric conversion unit is not inclined.

Also note that the term "face" in the Present Specification includes at least both flat faces and curved faces. The side faces of the waveguide may be flat faces or may be curved faces, as described in embodiments below. In a case where a side face of the waveguide is a curved face, an angle formed between this face and a perpendicular to the light receiving face of the photoelectric conversion unit, when viewed at a cross-section intersecting this face and including the perpendicular, is the angle of inclination.

The waveguide according to the embodiment has the second side face with a relatively great angle of inclination, so the incident face of the waveguide can be expanded. As a result, more light can be made to enter the waveguide. The waveguide further has the third side face having a relatively small angle of inclination, above the second side face, i.e., near the incident face of the waveguide. Accordingly, the reflection rate can be raised regarding light reaching the side faces of the waveguide near the incident face of the waveguide. Generally, the angle formed between light entering a photoelectric conversion device and a perpendicular (optical axis) to the light receiving face of the photoelectric conversion unit is not so great. Therefore, the smaller the angle of inclination of the side face of the waveguide is, the more light can be reflected. According to the waveguide of the embodiment, the first side face and third side face that have a relatively small angle of inclination, and the second side face having a relatively great angle of inclination are arranged, or arrayed, in the order of the first side face, second side face, and third side face, from the substrate. Thus, the reflection efficiency (rate) near the incident face can be increased while broadening the incident face of the waveguide. This configuration enables sensitivity to be increased as a result.

The waveguide may have another side face besides the first through third side faces. For example, the waveguide may have another side face disposed at the substrate side from the first side face. Alternatively, the waveguide may have another side face above the third side face. Alternatively, the waveguide may have another side face between the first side face and the second side face. Alternatively, the waveguide may have another side face between the second side face and the third side face.

Embodiments of the present disclosure will be described in detail with reference to the drawings. The present disclosure is not restricted to just the embodiments described below. Modifications where the configuration of the embodiments described below has been partially modified without departing from the essence of the present disclosure also are embodiments of the present disclosure. Further, examples where a partial configuration of one of the following embodiments is added to another embodiment, and examples where a partial configuration of one of the following embodiments is substituted with a partial configuration of another embodiment, also are embodiments of the present disclosure.

First Embodiment

Figure 1B:
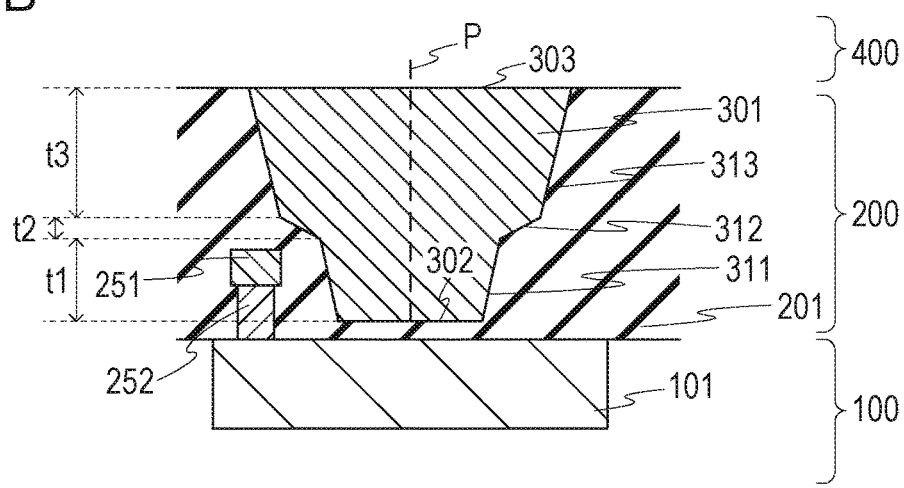
Figure 1C:
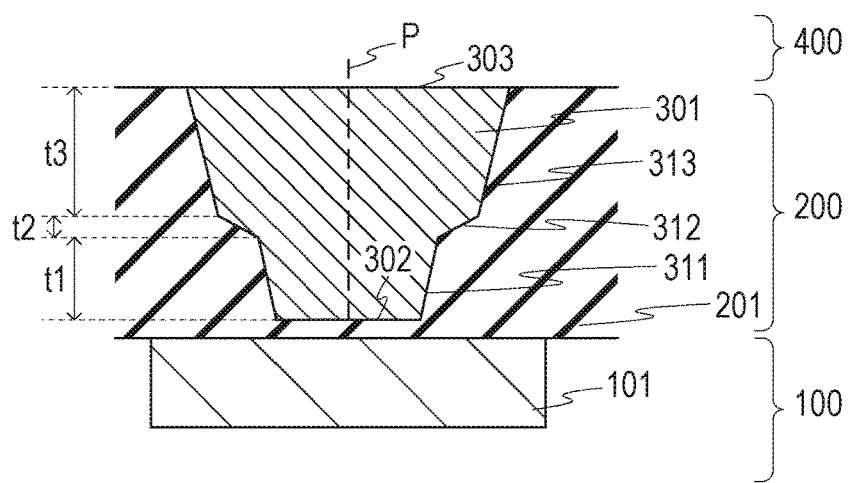

A first embodiment will be described. FIGS. 1A through 1C schematically illustrate the configuration of a photoelectric conversion device according to the first embodiment. FIG. 1A schematically illustrates the planar structure of the photoelectric conversion device. FIG. 1B schematically illustrates the cross-sectional structure of the photoelectric conversion device taken along IB-IB in FIG. 1A. FIG. 1C schematically illustrates the cross-sectional structure of the photoelectric conversion device taken along IC-IC in FIG. 1A.

The photoelectric conversion device includes a photoelectric conversion unit 101, and a waveguide 301 disposed above the photoelectric conversion unit 101. The waveguide 301 is disposed so as to be overlaid on the photoelectric conversion unit 101 in planar view, as illustrated in FIG. 1A. In the Present Specification, a situation where one member is disposed above another member, so that the one member is overlaid on the other member in planar view is expressed as the one member "covering" the other member.

The photoelectric conversion device includes wiring 251, and a contact plug 252 connecting the wiring 251 and the photoelectric conversion unit 101. This configuration enables charges generated at the photoelectric conversion unit 101 to be output from the wiring 251 as electric signals. The photoelectric conversion device may include a signal processing circuit connected to the wiring 251. Alternatively, the wiring 251 may be directly connected to an external device. The wiring 251 and contact plug 252 are not used in a photoelectric conversion device where change in the potential of the photoelectric conversion unit 101 is detected by capacitive coupling.

FIG. 1A further illustrates an outer edge of an incident face 303 of the waveguide 301, and an outer edge of an exit face 302 of the waveguide 301. The area of the exit face 302 is smaller than the area of the incident face 303 in planar view, which can be seen in FIG. 1A. The incident face 303 also encompasses the exit face 302 in planar view. This configuration enables incident light to the waveguide 301 to be efficiently guided to the photoelectric conversion unit 101. For example, part of the waveguide 301 covers the wiring 251. Accordingly, reflection of light entering this portion by the wiring 251 is reduced. As a result, the amount of light entering the photoelectric conversion unit 101 can be increased.

The photoelectric conversion device includes substrate 100, a wiring structure portion 200, and an optical unit 400, as illustrated in FIGS. 1B and 1C. The detailed structure of the optical unit 400 is omitted from FIGS. 1B and 1C.

The substrate 100 is a silicon substrate. Other examples of the substrate 100 include an inorganic semiconductor substrate, organic semiconductor substrate, inorganic photoelectric conversion film, organic photoelectric conversion film, and so forth. The photoelectric conversion unit 101 is disposed in the substrate 100.

The photoelectric conversion unit 101 converts incident light into charges. The photoelectric conversion unit 101 according to the present embodiment is a photodiode. The photoelectric conversion unit 101 has an N-type semiconductor region that makes up a PN junction and stores electrons as signal charges. The photoelectric conversion unit 101 may also include a P-type semiconductor region disposed on the N-type semiconductor region. The light receiving face of the photoelectric conversion unit 101 is an interface between the substrate 100 and an insulation member 201 disposed on the substrate 100. In a case where the P-type semiconductor region is provided, the interface between this P-type semiconductor region and the insulation member 201 makes up the light receiving face. In a case where the P-type semiconductor region is not provided, the interface between the N-type semiconductor region that stores signal charges and the insulation member 201 make up the light receiving face. In a case where holes are used as the signal changes, the N-type and P-type can be inverted. In a case where the substrate 100 being used is other than a silicon substrate, the interface between this substrate 100 and the insulation member 201 formed of material that is different from the material of the substrate 100 makes up the light receiving face.

The wiring structure portion 200 includes the insulation member 201 disposed on the substrate 100, the wiring 251 disposed on the insulation member 201, and the contact plug 252. The insulation member 201 is formed of silicon oxide, silicon nitride, silicon carbide, or the like. The insulation member 201 may be formed of a single material. Alternatively, the insulation member 201 may include multiple insulating films. The insulation member 201 electrically insulates the multiple wirings 251 from each other. Alternatively, the insulation member 201 electrically insulates between the wiring 251 and the substrate 100.

The insulation member 201 is disposed surrounding the waveguide 301. Specifically, an opening is provided to the insulation member 201. The opening is situated above the photoelectric conversion unit 101. The waveguide 301 is disposed within the opening. At least part of the refractive index of the waveguide 301 preferably is higher than the refractive index of the insulation member 201. This difference in refractive indices enables light to be reflected at t e side faces of the waveguide 301. As another example, light can be reflected at the side faces of the waveguide 301 by providing a reflecting member such as metal or the like at the side faces of the waveguide 301. As a further example, a gap or an air gap may be provided around the waveguide 301. That is to say, the waveguide 301 and the insulation member 201 may be separated from each other.

The waveguide 301 may be formed of a single material. For example, the waveguide 301 may be formed of silicon nitride or organic resin. Alternatively, the waveguide 301 may be formed of multiple layers with different compositions. For example, multiple silicon nitride layers are formed by multiple film formation processes having different conditions from each other. The process conditions differ, so the compositions of the multiple silicon nitride layers may have composition ratios different from each other. As another example, the waveguide 301 includes a liner layer formed of silicon oxide and a core layer formed of silicon nitride. The liner layer is a thin insulating film disposed along the side face of the opening of the insulation member 201. The core layer is an insulating film filling the remaining portion of the opening of the insulation member 201.

The waveguide 301 has a first side face 311, a second side face 312, and a third side face 313, arrayed in that order from the substrate 100. The side faces of the waveguide 301 are, for example, faces of contact between the waveguide 301 and the insulation member 201. Accordingly, a side face of the waveguide 301 may agree with a side face of the opening of the insulation member 201. The insulation member 201 may contain multiple insulating films that come into contact with the first side face 311, second side face 312, and third side face 313 of the waveguide 301.

The first side face 311, second side face 312, and third side face 313 are each inclined, as illustrated in FIGS. 1B and 1C. That is to say, the first side face 311, second side face 312, and third side face 313 each have an angle of inclination that is greater than 0 degrees. The angle of inclination of a side face of the waveguide 301 is an angle formed between a perpendicular P as to the light receiving face of the photoelectric conversion unit 101, and the side face of the waveguide 301, as described earlier. The perpendicular P as to the light receiving face of the photoelectric conversion unit 101 is illustrated in FIGS. 1B and 1C. That is to say, FIGS. 1B and 1C schematically illustrate cross-sections including the perpendicular P as to the light receiving face of the photoelectric conversion unit 101.

Figure 2:
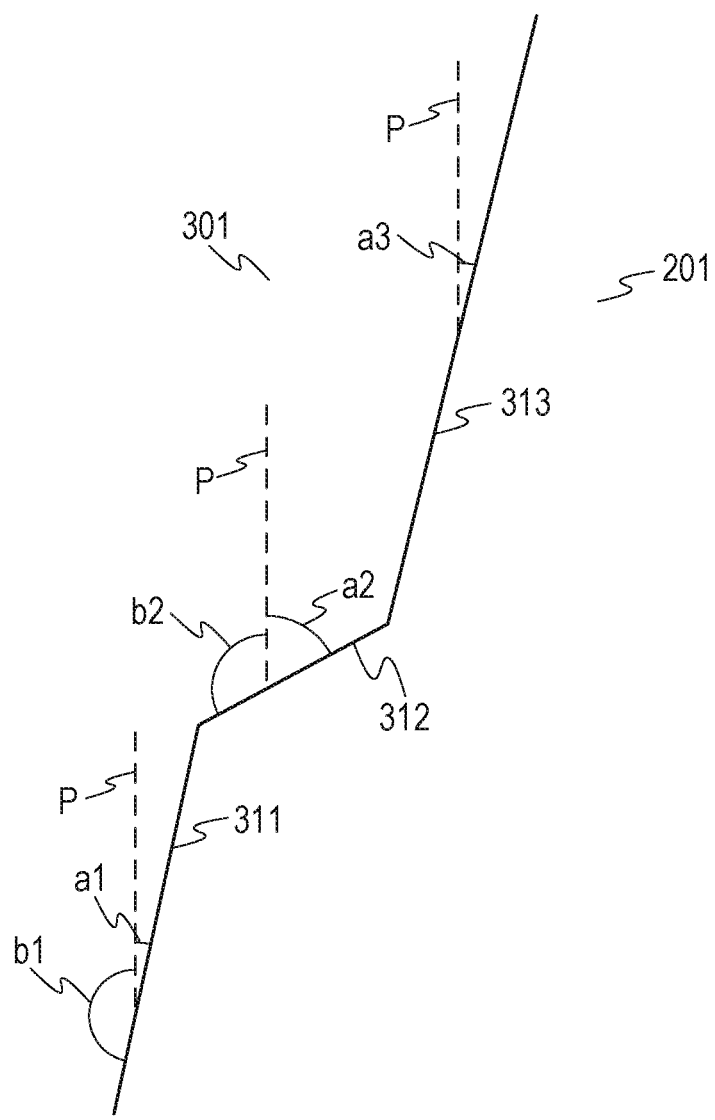
FIG. 2 is a diagram schematically illustrating a section structure of a photoelectric conversion device.

The angle of inclination will be described by way of FIG. 2. FIG. 2 is a diagram illustrating the side faces of the waveguide 301 in FIGS. 1B and 1C enlarged. The same members in FIGS. 1B and 1C are denoted by the same reference numerals. In a cross-section including the perpendicular P, the first side face 311 of the waveguide 301 and the perpendicular P form two angles, an angle a1 and an angle b1, as illustrated in FIG. 2. Of these two angles, the angle a1 is smaller than 90 degrees, so the angle a1 is the angle of inclination of the of the first side face 311 of the waveguide 301. In the same way, the second side face 312 of the waveguide 301 has an angle of inclination a2, and the third side face 313 of the waveguide 301 has an angle of inclination a3.

The angle of inclination a1 of the first side face 311 of the waveguide 301 is smaller than the angle of inclination a2 of the second side face 312 of the waveguide 301 in the present embodiment. Also, the angle of inclination a3 of the third side face 313 of the waveguide 301 is smaller than the angle of inclination a2 of the second side face 312 of the waveguide 301. That is to say, a side face having a small angle of inclination, a side face having a great angle of inclination, and a side face having a small angle of inclination, are arrayed in that order from the substrate 100.

The incident face 303 of the waveguide 301 can be broadened due to the waveguide 301 having the second side face 312 of which the angle of inclination is great. As a result, a great amount of light can be input to the waveguide 301. Further, the waveguide 301 has the third side face 313 of which the angle of inclination is small, above the second side face 312, i.e., near the incident face 303. Accordingly, the reflection rate can be raised regarding light reaching the side face of the waveguide 301 near the incident face 303 of the waveguide 301. This configuration consequently enables sensitivity to be improved. Studies by the Present Inventors confirmed that sensitivity was improved approximately 8.5% over an example where the angle of inclination of the side face continuously increases, in a case where the area of the incident face 303 in planar view, the area of the exit face 302, and the height of the waveguide 301, are the same.

Specific numerical values are not restricted regarding the angle of inclination of the first side face 311, the angle of inclination of the second side face 312, and the angle of inclination of the third side face 313. Preferably, the angle of inclination of the first side face 311 is included in a range of 5 degrees to 20 degrees. Preferably, the angle of inclination of the second side face 312 is included in a range of 55 degrees to 85 degrees. Preferably, the angle of inclination of the third side face 313 is included in a range of 5 degrees to 20 degrees. The ratio of the incident face 303 and exit face 302, and the height of the waveguide 301, can be designed with a good balance, by including the angle of inclination of each of the side faces in these ranges. Consequently, sensitivity can be improved.

The angle of inclination of the third side face 313 is preferably smaller than the angle of inclination of the first side face 311. That is to say, the side face at the portion closer to the incident face 303 of the waveguide 301 preferably is closer to being vertical as to the light receiving face of the photoelectric conversion unit 101. This configuration enables sensitivity to be further improved.

A first portion forming the first side face 311 of the waveguide 301 has a thickness of t1, as illustrated in FIGS. 1B and 1C. A second portion forming the second side face 312 of the waveguide 301 has a thickness of t2. A third portion forming the third side face 313 of the waveguide 301 has a thickness of t3. Preferably, the thickness t1 is greater than the thickness t2, and the thickness t3 is greater than the thickness t2. The height of the waveguide 301 can be increased according to this configurations a result, sensitivity can be increased even in a case where a great number of wiring layers are disposed on the substrate 100.

Next, the structure of the optical unit 400 will be described with reference to FIGS. 3A through 3E. FIGS. 3A through 3E schematically illustrate cross-sectional structures of the photoelectric conversion device. Members that are the same as those in FIGS. 1A through 2 are denoted by the same reference numerals. FIGS. 3A through 3E only illustrate the upper portion of the waveguide 301 and portions of the photoelectric conversion device above the waveguide 301. In the example illustrated in FIG. 3A, part of the insulation member 201 is disposed on the waveguide 301. The portion of the insulation member 201 that is disposed on the waveguide 301, and the portion thereof disposed to the sides, may be formed by different processes.

Figure 3A:
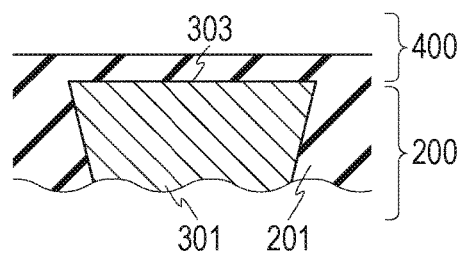
FIGS. 3A through 3E are diagrams schematically illustrating section structures of a photoelectric conversion device.
Figure 3B:
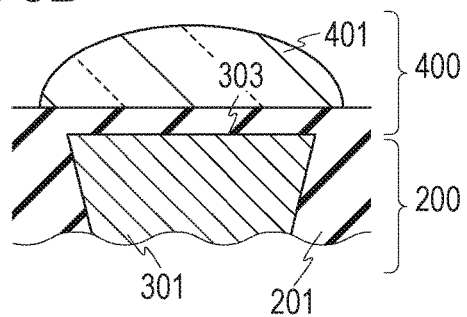

In the example illustrated in FIG. 3B, a microlens 401 is disposed above the waveguide 301. The microlens 401 may be disposed covering the waveguide 301. The microlens 401 is capable of collecting light toward the incident face 303 of the waveguide 301. Consequently, the microlens 401 can improve sensitivity. In a case where multiple photoelectric conversion units 101 are provided, the microlenses 401 can reduce mixture of colors. Note that the microlens 401 and waveguide 301 may be disposed in contact with each other.

Figure 3C:
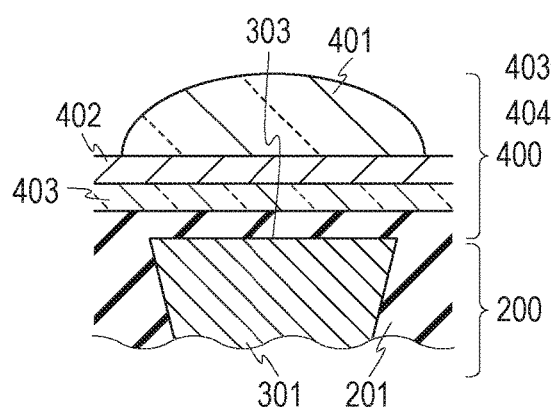

In the example illustrated in FIG. 3C, a color filter 403, a planarization layer 402, and the microlens 401 are disposed above the waveguide 301. The color filter 403, planarization layer 402, and microlens 401, are arrayed from the substrate 100 side in this order. The color filter 403 may be disposed covering the waveguide 301.

The color filter 403 selectively transmits light of a particular wavelength. This enables color images to be acquired, or images for special usage to be acquired. The planarization layer 402 lessens unevenness that has occurred due to the color filter 403. Accordingly, image quality can be improved in a photoelectric conversion device that has multiple photoelectric conversion units 101. Note that the planarization layer 402 is not indispensable.

Figure 3D:
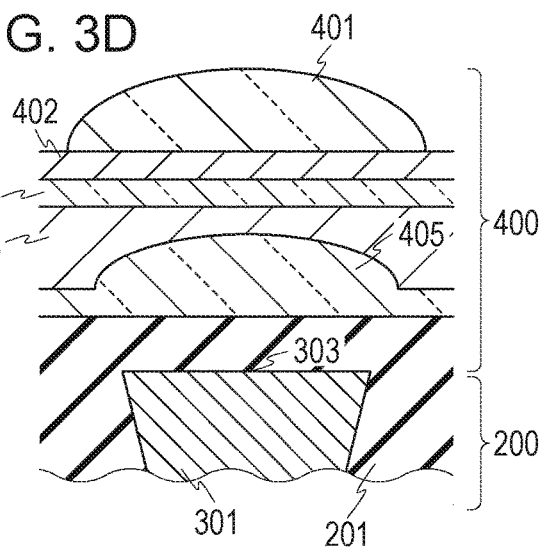

In the example illustrated in FIG. 3D, an interlayer lens 405, a planarization layer 404, the color filter 403, the planarization layer 402, and the microlens 401 are disposed above the waveguide 301. The interlayer lens 405, planarization layer 404, color filter 403, planarization layer 402, and microlens 401, are arrayed from the substrate 100 side in this order.

The interlayer lens 405 is capable of collecting light toward the incident face 303 of the waveguide 301. Accordingly, light collected by the microlens 401 is input to the waveguide 301 even more efficiently. As a result, sensitivity can be improved. The planarization layer 404 lessens unevenness that has occurred due to the interlayer lens 405. Accordingly, image quality can be improved in a photoelectric conversion device that has multiple photoelectric conversion units 101. Note that the planarization layer 404 is not indispensable.

Figure 3E:
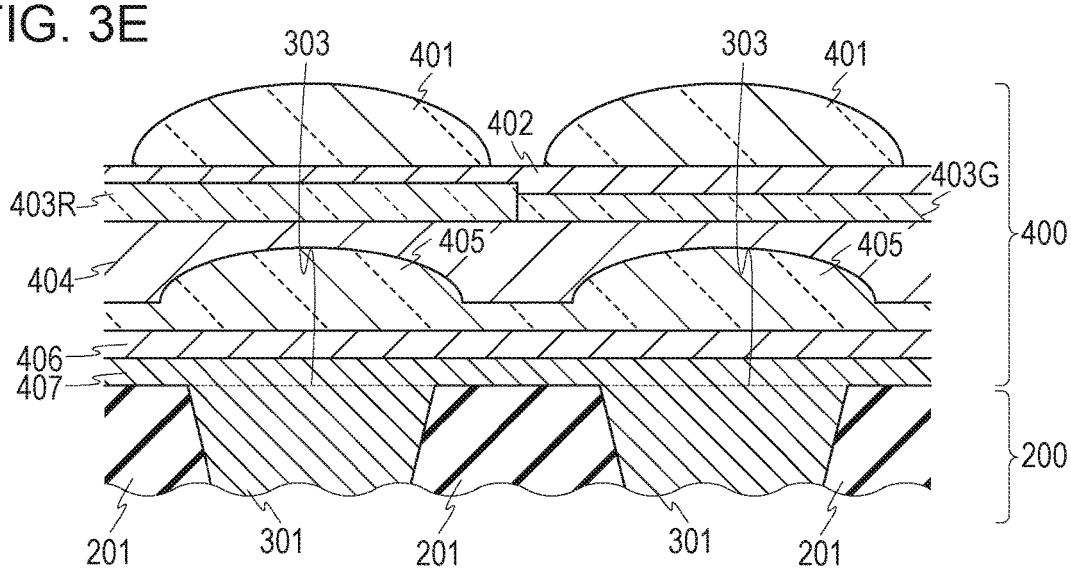

In the example illustrated in FIG. 3E, the photoelectric conversion device has multiple photoelectric conversion units 101 (omitted from illustration). A corresponding waveguide 301 is provided to each photoelectric conversion unit 101. A linking portion 407, a low-refractive-index layer 406, the interlayer lens 405, the planarization layer 404, the color filter 403, the planarization layer 402, and the microlens 401, are disposed above the waveguide 301.

The multiple waveguides 301 are linked to each other by the linking portion 407, as illustrated in FIG. 3E. The linking portion 407 is formed of the same material as the waveguide 301. The linking portion 407 is also formed integrally with the waveguide 301, by the same process. The thickness of the linking portion 407 preferably is in the range of approximately 20 nm to 100 nm. The linking portion 407 is formed on the insulation member 201, as illustrated in FIG. 35. Accordingly, the insulation member 201 partially surrounds the waveguide members including the waveguide 301 and linking portion 407.

The linking portion 407 can increase the amount of light entering the waveguide 301. The reason is that incident light to the linking portion 407 is propagated to the waveguide 301 by containment effects of the linking portion 407. The linking portion 407 also enables variation in sensitivity among the multiple photoelectric conversion units 101 to be reduced.

In the example illustrated in FIG. 3E, the incident face 303 of the waveguide 301 is an imaginary contact face between the waveguide 301 and the linking portion 407. Specifically, a plane, where the top face of the insulation member 201 disposed to the sides of the waveguide 301 is extended to the waveguide 301, is the incident face 303 of the waveguide 301. The outer perimeter of the incident face 303 of the waveguide 301 in this example is illustrated in FIG. 1A.

The low-refractive-index layer 406 is disposed between the linking portion 407 and interlayer lens 405. The refractive index of the low-refractive-index layer 406 is lower than the refractive index of the material from which the interlayer lens 405 is formed. According to this configuration, light collecting capabilities of the interlayer lens 405 can be improved.

The color filter 403 also includes a color filter 403R of a first color (e.g., red), and a color filter 403G of a second color (e.g., green). This configuration provides for a color image. In a case where color filters 403 of multiple colors are provided, unevenness tends to increase due to the color filters 403. Accordingly, the advantages of improved image quality due to the planarization layer 402 are marked.

As described above, the waveguide 301 according to the present embodiment has the first side face 311, second side face 312, and third side face 313 arrayed in that order from the substrate 100. The angle of inclination of the first side face 311 is smaller than the angle of inclination of the second side face 312. The angle of inclination of the third side face 313 is smaller than the angle of inclination of the second side face 312. According to this configuration, sensitivity can be improved.

Second Embodiment

A second embodiment will be described. The photoelectric conversion device according to the first embodiment and the photoelectric conversion device according to the second embodiment differ from each other with respect to the shape of the side faces of the waveguide 301. Accordingly, description will be made below primarily regarding portions that differ from the first embodiment, and description of portions that are the same as in the first embodiment will be omitted.

Figure 4A:
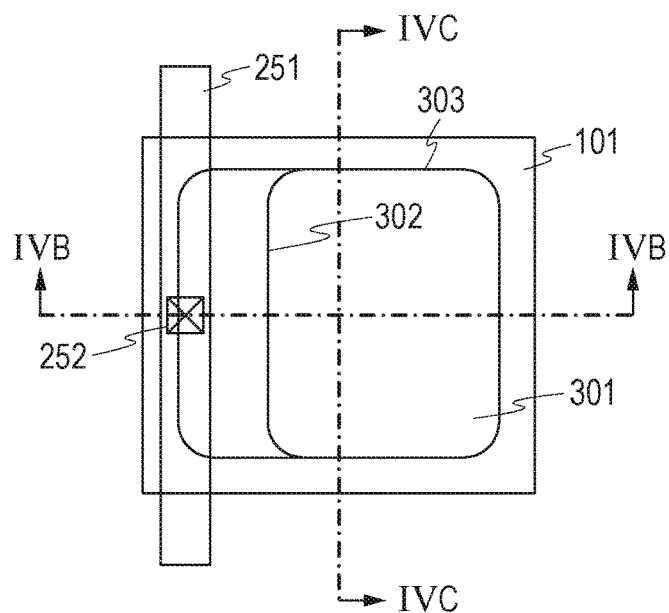
FIGS. 4A through 4C schematically illustrate a photoelectric conversion device, FIG. 4A illustrating a planar configuration of the photoelectric conversion device and FIGS. 4B and 4C illustrating section structures of the photoelectric conversion device.
Figure 4B:
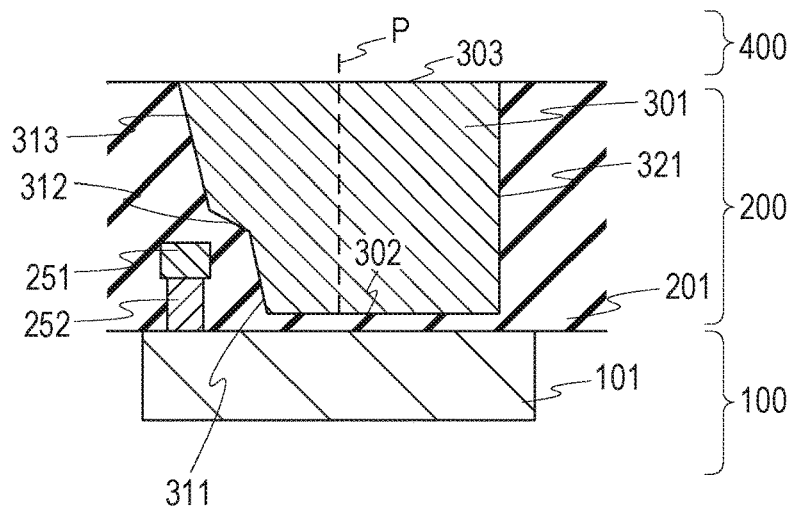
Figure 4C:
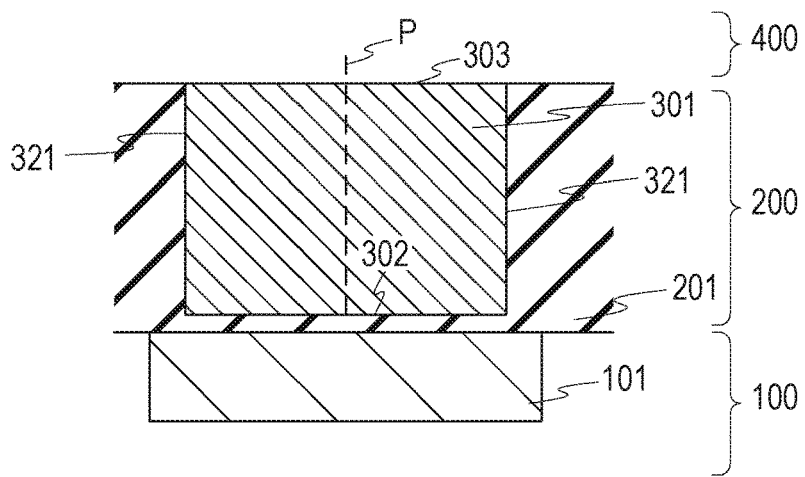

FIGS. 4A through 4C schematically illustrate the configuration of a photoelectric conversion device according to the second embodiment. FIG. 4A schematically illustrates the planar structure of the photoelectric conversion device. FIG. 4B schematically illustrates the cross-sectional structure of t e photoelectric conversion device taken along IVB-IVB. FIG. 4C schematically illustrates the cross-sectional structure of the photoelectric conversion device taken along IVC-IVC. Parts that are the same as in FIGS. 1A through 3E are denoted by the same reference numerals.

The photoelectric conversion device includes the photoelectric conversion unit 101, and the waveguide 301 disposed above the photoelectric conversion unit 101. The waveguide 301 is disposed so as to be overlaid on the photoelectric conversion unit 101 in planar view, as illustrated in FIG. 4A.

The photoelectric conversion device includes wiring 251, and the contact plug 252 connecting the wiring 251 and the photoelectric conversion unit 101. The configuration of the wiring 251 and contact plug 252 is the same as in the first embodiment. The wiring 251 and contact plug 252 may be omitted from the configuration, in the same way as in the first embodiment.

FIG. 4A further illustrates the outer edge of the incident face 303 of the waveguide 301, and the outer edge of the exit face 302 of the waveguide 301. The area of the exit face 302 is smaller than the area of the incident face 303 in planar view, which can be seen in FIG. 4A. This configuration enables incident light to the waveguide 301 to be efficiently guided to the photoelectric conversion unit 101. For example, part of the waveguide 301 covers the wiring 251. Accordingly, reflection of light entering this portion by the wiring 251 is reduced. As a result, the amount of light entering the photoelectric conversion unit 101 can be increased.

Part of the outer edge of the incident face 303 and part of the outer edge of the exit face 302 are overlaid in planer view in the present embodiment. That is to say, part of the side faces of the waveguide 301 is vertical to the light receiving face of the photoelectric conversion unit 101. In other words, part of the side faces of the waveguide 301 is not inclined. This is one point that differs from the first embodiment.

The photoelectric conversion device includes the substrate 100, the wiring structure portion 200, and the optical unit 400, as illustrated in FIGS. 4B and 4C. The detailed structure of the optical unit 400 is omitted from FIGS. 4B and 4C.

The structure of the substrate 100 and the photoelectric conversion unit 101 distributed to the substrate 100 is the same as in the first embodiment. Accordingly, description of the substrate 100 will be omitted here. Also, the configurations illustrated in FIGS. 3A through 3E are used for the optical unit 400, in the same way as the first embodiment. Accordingly, description regarding the optical unit 400 will be omitted.

The wiring structure portion 200 includes the insulation member 201, the wiring 251 disposed on the insulation member 201, and the contact plug 252. The wiring structure portion 200 according to the present embodiment is the same as the wiring structure portion 200 in the first embodiment, except for the shape of the opening of the insulation member 201 and the shape of the waveguide 301. Accordingly, description other than that regarding the shape of the opening will be omitted here.

The insulation member 201 is disposed surrounding the waveguide 301. Specifically, an opening is provided in the insulation member 201 disposed upon the substrate 100. The opening is situated above the photoelectric conversion unit 101. The waveguide 301 is disposed within the opening. The material used for the waveguide 301 is the same as that in the first embodiment. The structure of the waveguide 301 is also the same as that in the first embodiment, except for the shape of the side faces of the waveguide 301.

The waveguide 301 has the first side face 311, second side face 312, and third side face 313, arrayed in that order from the substrate 100. The side faces of the waveguide 301 are faces of contact between the waveguide 301 and the insulation member 201, for example. Accordingly, the side faces of the waveguide 301 may agree with the side faces of the opening of the insulation member 201. The insulation member 201 may include multiple insulating films coming into contact with each of the first side face 311, second side face 312, and third side face 313, of the waveguide 301.

Each of the first side face 311, second side face 312, and third side face 313 are inclined, as illustrated in FIGS. 4B and 4C. That is to say, the first side face 311, second side face 312, and third side face 313 each have an angle of inclination that is greater than 0 degrees. The angle of inclination of a side face of the waveguide 301 is an angle formed between a perpendicular P as to the light receiving face of the photoelectric conversion unit 101, and the side face of the waveguide 301, as described earlier. The perpendicular P as to the light receiving face of the photoelectric conversion unit 101 is illustrated in FIGS. 4B and 4C. That is to say, FIGS. 4B and 4C schematically illustrate cross-sections including the perpendicular P as to the light receiving face of the photoelectric conversion unit 101.

The angle of inclination of the first side face 311 of the waveguide 301 is smaller than the angle of inclination of the second side face 312 of the waveguide 301 in the present embodiment. Also, the angle of inclination of the third side face 313 of the waveguide 301 is smaller than the angle of inclination of the second side face 312 of the waveguide 301. That is to say, a side face having a small angle of inclination, a side face having a great angle of inclination, and a side face having a small angle of inclination, are arrayed in that order from the substrate 100. This point is the same as in the first embodiment. That is to say, the description regarding FIG. 2 in the first embodiment is also applicable to the present embodiment.

The incident face 303 of the waveguide 301 can be broadened due to the waveguide 301 having the second side face 312 of which the angle of inclination is great. As a result, a great amount of light can be input to the waveguide. Further, the waveguide 301 has the third side face 313 of which the angle of inclination is small, above the second side face 312, i.e., near the incident face 303. Accordingly, the reflection rate can be raised regarding light reaching the side face of the waveguide 301 near the incident face 303 of the waveguide 301. This configuration consequently enables sensitivity to be improved.

Further, the waveguide 301 according to the present embodiment has a side face 321 vertical to the light receiving face of the photoelectric conversion unit 101. In other words, the waveguide 301 has a side face 321 that is not inclined. According to this configuration, just part of the side faces of the waveguide 301 may be inclined. As a result, sensitivity can be improved.

The wiring 251 is disposed covering part of the photoelectric conversion unit 101, as illustrated in FIG. 4A. The portion of the waveguide 301 where at least the wiring 251 has been disposed thereupon preferably has an inclined side face, to guide the incident light to the wiring 251 to the photoelectric conversion unit 101. Specifically, the waveguide 301 has the first side face 311, second side face 312, and third side face 313, each of which are inclined in the present embodiment.

Other portions of the photoelectric conversion unit 101 are not covered by the wiring 251. In a case where no wiring 251 is disposed between the waveguide 301 and photoelectric conversion unit 101, the side face of the waveguide 301 does not have to be inclined. Generally, the angle formed between the incident light and the perpendicular P as to the light receiving face of the photoelectric conversion unit 101 is not very great, so the smaller the angle of inclination of the side face of the waveguide 301 is, the more light can be reflected. Accordingly, the side face 321 that is vertical to the light receiving face of the photoelectric conversion unit 101 can reflect more light. As a result, sensitivity can be improved by the waveguide 301 according to the present embodiment.

As described above, the waveguide 301 according to the present embodiment has the first side face 311, second side face 312, and third side face 313, arrayed in that order from the substrate 100. The angle of inclination of the first side face 311 is smaller than the angle of inclination of the second side face 312. Also, the angle of inclination of the third side face 313 is smaller than the angle of inclination of the second side face 312. According to this configuration, sensitivity can be improved, in the same way as in the first embodiment.

Just part of the side face of the waveguide 301 may be inclined in accordance with the structure of the photoelectric conversion device in the present embodiment. As a result, sensitivity can be improved even further.

Third Embodiment

A third embodiment will be described. The photoelectric conversion device according to the first embodiment and the photoelectric conversion device according to the third embodiment differ from each other with respect to the planar shape of the waveguide 301. Accordingly, description will be made below primarily regarding portions that differ from the first embodiment, and description of portions that are the same as in the first embodiment will be omitted.

Figure 5A:
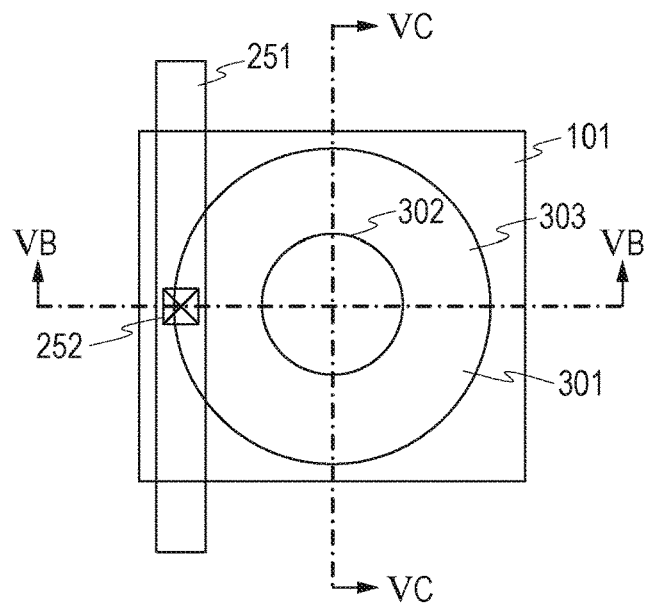
FIGS. 5A through 5C schematically illustrate a photoelectric conversion device, FIG. 5A illustrating a planar configuration of the photoelectric conversion device and FIGS. 5B and 5C illustrating section structures of the photoelectric conversion device.
Figure 5B:
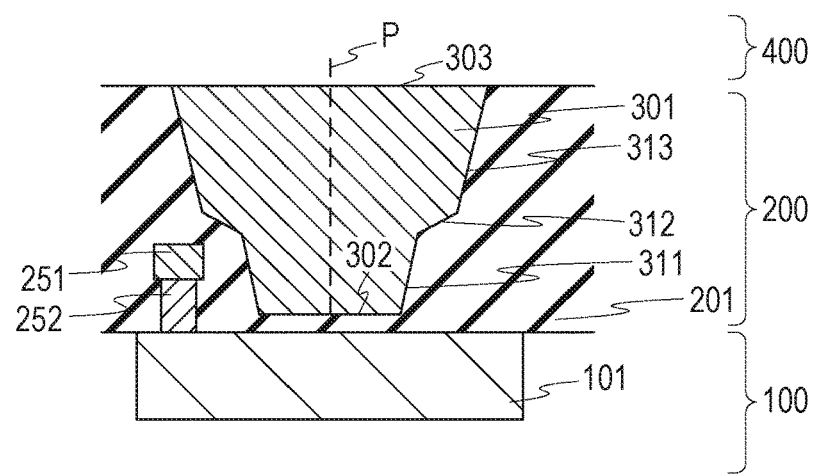
Figure 5C:
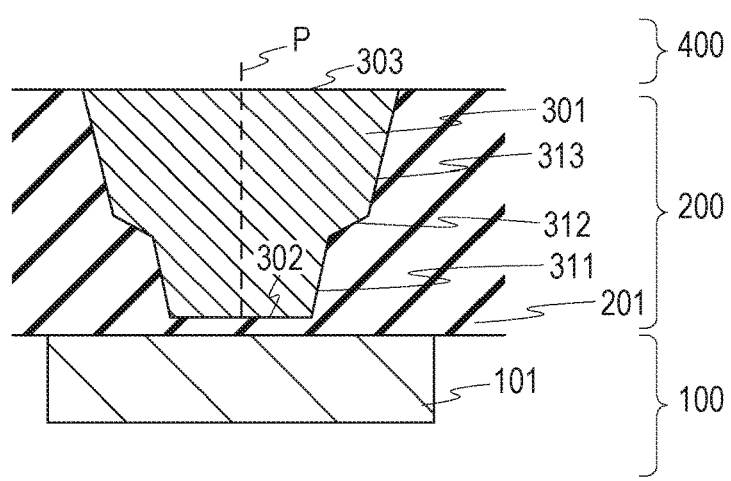

FIGS. 5A through 5C schematically illustrate the configuration of a photoelectric conversion device according to the third embodiment. FIG. 5A schematically illustrates the planar structure of the photoelectric conversion device. FIG. 5E schematically illustrates the cross-sectional structure of the photoelectric conversion device taken along FIG. 5C schematically illustrates the cross-sectional structure of the photoelectric conversion device taken along VC-VC. Parts that are the same as in FIGS. 1A through 4C are denoted by the same reference numerals.

The photoelectric conversion device includes the photoelectric conversion unit 101, and the waveguide 301 disposed above the photoelectric conversion unit 101. The waveguide 301 is disposed so as to be overlaid on the photoelectric conversion unit 101 in planar view, as illustrated in FIG. 5A.

The photoelectric conversion device includes wiring 251, and the contact plug 252 connecting the wiring 251 and the photoelectric conversion unit 101. The wiring 251 and contact plug 252 may be omitted from the configuration, in the same way as in the first embodiment.

FIG. 5A further illustrates the outer edge of the incident face 303 of the waveguide 301, and the outer edge of the exit face 302 of the waveguide 301. The area of the exit face 302 is smaller than the area of the incident face 303 in planar view, which can be seen in FIG. 5A. The incident face 303 also encompasses the exit face 302 in planar view. This configuration enables incident light to the waveguide 301 to be efficiently guided to the photoelectric conversion unit 101. For example, part of the waveguide 301 covers the wiring 251. Accordingly, reflection of light entering this portion by the wiring 251 is reduced. As a result, the amount of light entering the photoelectric conversion unit 101 can be increased.

The outer edge of the incident face 303 is circular in planar view in the present embodiment. The outer edge of the exit face 302 also is circular in planar view in the present embodiment. Further, the cross-section of the waveguide 301 has a circular outer edge when cut along a plane parallel to the light receiving face of the photoelectric conversion unit 101. This point differs from the first embodiment.

Having a circular shape for the waveguide 301 in planar view is advantageous in that the area of the exit face 302 can be reduced. That is to say, even in a case where other elements are distributed on the substrate 100 besides the photoelectric conversion unit 101, light can be efficiently collected to the photoelectric conversion unit 101. Also, the side face of the waveguide 301 is a curved face having a generally uniform curvature over the entire perimeter of the waveguide 301. Accordingly, there is little difference in reflection rate of light depending on the location. As a result, light can be efficiently collected to the photoelectric conversion unit 101.

The photoelectric conversion device includes the substrate 100, the wiring structure portion 200, and the optical unit 400, as illustrated in FIGS. 5B and 5C. The detailed structure of the optical unit 400 is omitted from FIGS. 5B and 5C. The substrate 100, wiring structure portion 200, and optical unit 400 according to the present embodiment are the same as the substrate 100, wiring structure portion 200, and optical unit 400 according to the first embodiment, except for the planar shape of the waveguide 301 described above. Accordingly, description regarding the first embodiment, and description regarding FIGS. 1A through 3C is all incorporated in the photoelectric conversion device of the present embodiment.

The insulation member 201 is disposed surrounding the waveguide 301. Specifically, an opening is provided in the insulation member 201 disposed upon the substrate 100. The opening is situated above the photoelectric conversion unit 101. The waveguide 301 is disposed within the opening. The material used for the waveguide 301 is the same as that in the first embodiment. The structure of the waveguide 301 is also the same as that in the first embodiment, except for the shape of the waveguide 301.

The waveguide 301 has the first side face 311, second side face 312, and third side face 313, arrayed in that order from the substrate 100. The side faces of the waveguide 301 are faces of contact between the waveguide 301 and the insulation member 201, for example. Accordingly, the side faces of the waveguide 301 may agree with the side faces of the opening of the insulation member 201. The insulation member 201 may include multiple insulating films coming into contact with each of the first side face 311, second side face 312, and third side face 313 of the waveguide 301.

Each of the first side face 311, second side face 312, and third side face 313 are inclined, as illustrated in FIGS. 5B and 5C. That is to say, the first side face 311, second side face 312, and third side face 313 each have an angle of inclination that is greater than 0 degrees. The angle of inclination of a side face of the waveguide 301 is an angle formed between a perpendicular P as to the light receiving face of the photoelectric conversion unit 101, and the side face of the waveguide 301, as described earlier. The perpendicular P as to the light receiving face of the photoelectric conversion unit 101 is illustrated in FIGS. 5B and 5C. That is to say, FIGS. 5B and 5C schematically illustrate cross-sections including the perpendicular P as to the light receiving face of the photoelectric conversion unit 101.

The angle of inclination of the first side face 311 of the waveguide 301 is smaller than the angle of inclination of the second side face 312 of the waveguide 301. Also, the angle of inclination of the third side face 313 of the waveguide 301 is smaller than the angle of inclination of the second side face 312 of the waveguide 301. That is to say, a side face having a small angle of inclination, a side face having a great angle of inclination, and a side face having a small angle of inclination, are arrayed in that order from the substrate 100. This point is the same as in the first embodiment. That is to say, the description regarding FIG. 2 in the first embodiment is also applicable to the present embodiment.

The side face of the waveguide 301 in the present embodiment is a curved face. Accordingly, the angle of inclination is expressed by the angle formed between the perpendicular P and the side face of the waveguide 301, at a cross-section including the perpendicular P as to the light receiving face of the photoelectric conversion unit 101.

The incident face 303 of the waveguide 301 can be broadened due to the waveguide 301 having the second side face 312 of which the angle of inclination is great. As a result, a great amount of light can be input to the waveguide. Further, the waveguide 301 has the third side face 313 of which the angle of inclination is small, above the second side face 312, i.e., near the incident face 303. Accordingly, the reflection rate can be raised regarding light reaching the side face of the waveguide 301 near the incident face 303 of the waveguide 301. This configuration consequently enables sensitivity to be improved.

The shape of the waveguide 301 in planar view is circular in the photoelectric conversion device according to the present embodiment. According to this configuration, advantages can be obtained of improved light collection efficiency, in addition to the advantages of the first embodiment.

Fourth Embodiment

Figure 6:
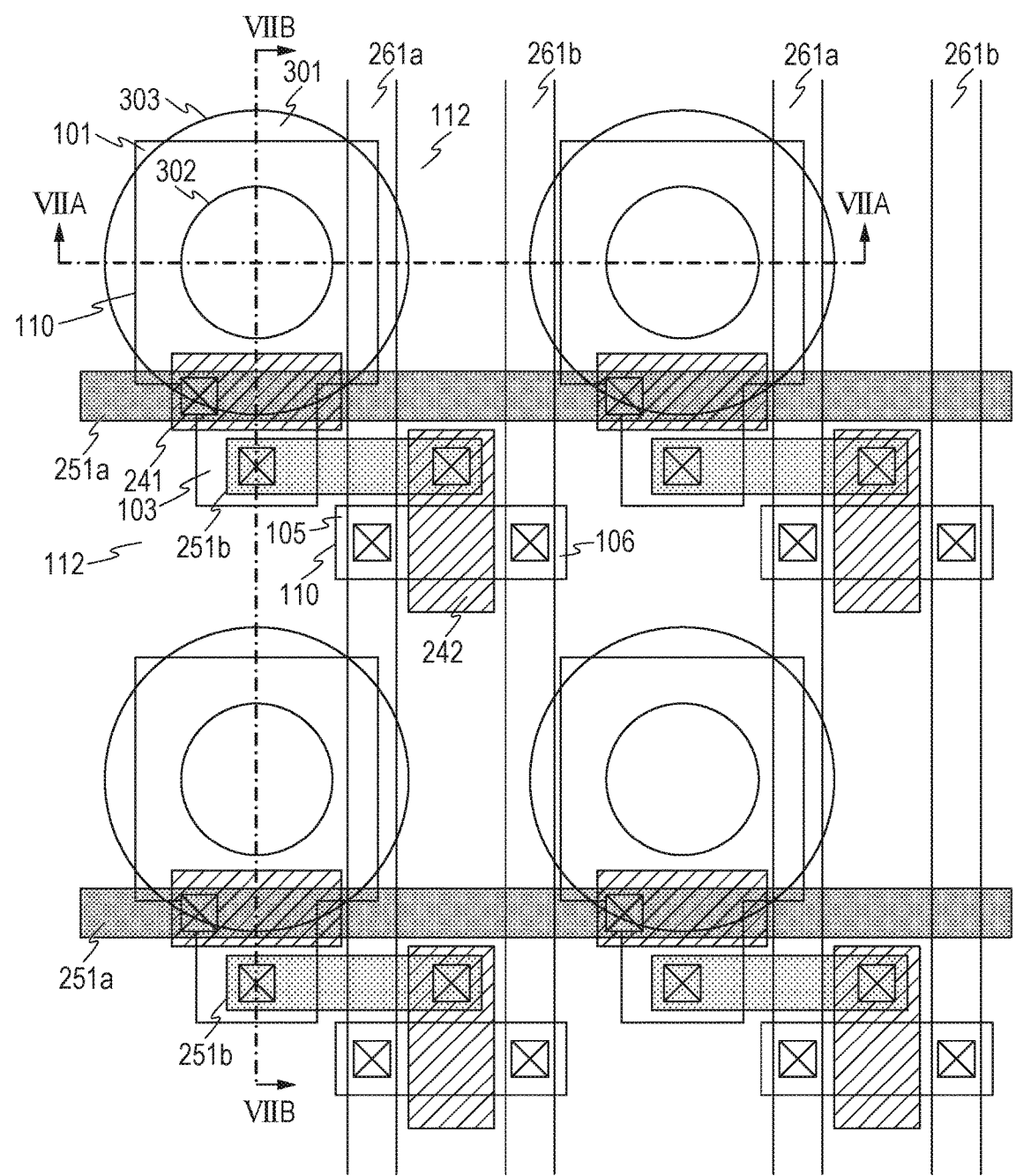
FIG. 6 is a diagram schematically illustrating a planar structure of a photoelectric conversion device.
Figure 7A:
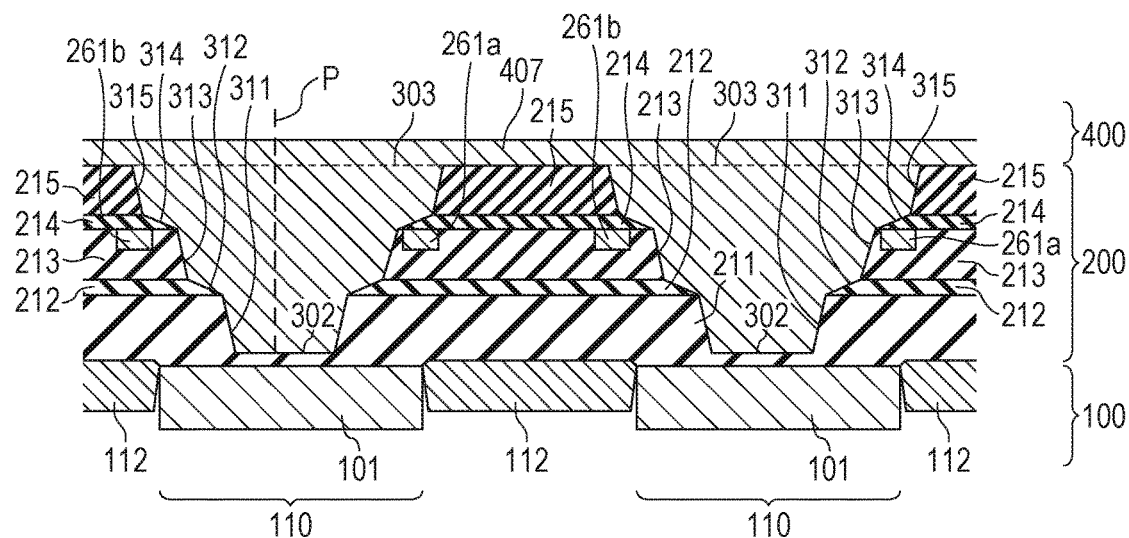
FIGS. 7A and 7B are diagrams schematically illustrating section structures of a photoelectric conversion device.
Figure 7B:
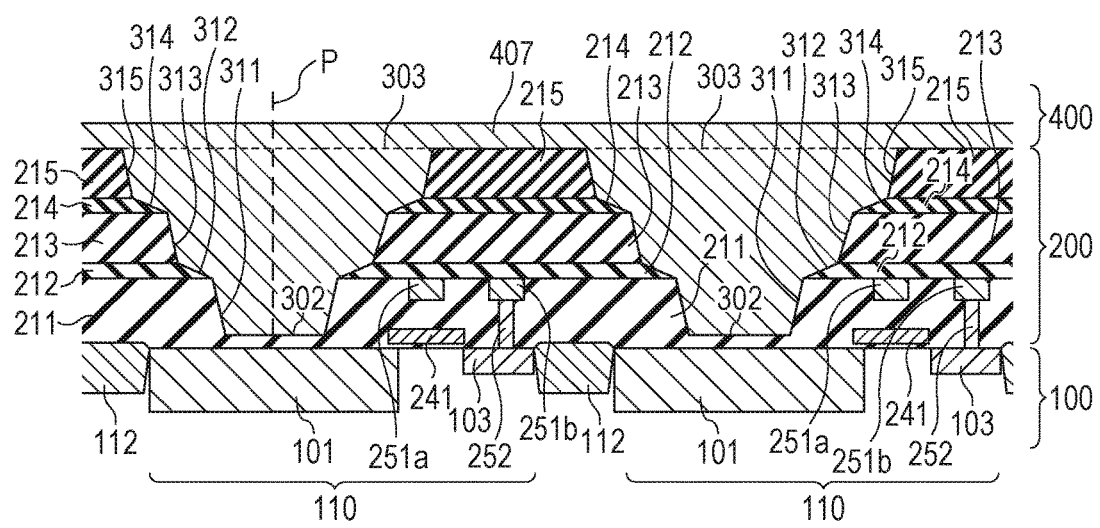

A fourth embodiment will be described. FIG. 6 schematically illustrates the planar structure of the photoelectric conversion device according to the fourth embodiment. FIG. 7A schematically illustrates the cross-sectional structure of the photoelectric conversion device taken along VIIA-VIIA in FIG. 6. FIG. 7B schematically illustrates the cross-sectional structure of the photoelectric conversion device taken along VIIB-VIIB in FIG. 6. Parts that are the same as in FIGS. 1A through 5C are denoted by the same reference numerals. FIG. 6 illustrates a layout where the same structures are repeated, so reference symbols are omitted from the repetitive portions.

The photoelectric conversion device according to the present embodiment differs from the photoelectric conversion device according to the first through third embodiments with respect to the point of having other elements disposed on the substrate 100 besides the photoelectric conversion unit 101, and having multiple wiring layers. Accordingly, description will be made below primarily regarding portions that differ from the first through third embodiments, and description of portions that are the same as in any of the first through third embodiments will be omitted as appropriate.

The photoelectric conversion device includes the photoelectric conversion unit 101, and the waveguide 301 disposed above the photoelectric conversion unit 101. The waveguide 301 is disposed so as to be overlaid on the photoelectric conversion unit 101 in planar view, as illustrated in FIG. 6. That is to say, the waveguide 301 is disposed so as to cover the photoelectric conversion unit 101.

The photoelectric conversion device further includes a floating diffusion portion 103 (hereinafter, "FD portion 103"), and an amplifying transistor, disposed on the substrate 100. A transfer gate electrode 241, an amplifying gate electrode 242, the wiring 251, and wiring 261, are disposed on the substrate 100. The wiring 251 and wiring 261 are connected to the subs rate 100, transfer gate electrode 241, or amplifying gate electrode 242 by contact plugs. No reference numerals are given to denote the contact plugs in FIG. 6 for sake of simplicity, but squares having two diagonal lines drawn within indicate the positions of the contact plugs.

The configuration of the photoelectric conversion unit 101 is the same as that of the photoelectric conversion unit 101 according to the first embodiment. Signal charges generated at the photoelectric conversion unit 101 are transferred to the FD portion 103 by the transfer gate electrode 241. The photoelectric conversion unit 101, transfer gate electrode 241, and FD portion 103 make up a transfer transistor. Wiring 251a is connected to the transfer gate electrode 241 via a contact plug. The wiring 251a supplies, to the transfer gate electrode 241, a control signal that controls transfer of a signal charge.

The FD portion 103 is connected to the amplifying gate electrode 242 via wiring 251b. The amplifying gate electrode 242, and a source region 105 and a drain region 106 provided to the substrate 100, make up an amplifying transistor. Wiring 261a is connected to the source region 105. The wiring 261a makes up an output line where signals are output. Wiring 261b is connected to the drain region 106. The wiring 261b makes up a power supply line that supplies power supply to the amplifying transistor. According to this configuration, the amplifying transistor can output signals based on signal charges to the output line. That is to say, the amplifying transistor makes up an amplifying unit.

Also, the photoelectric conversion device according to the present embodiment includes multiple photoelectric conversion units 101. A transfer transistor, an amplifying transistor, and a waveguide 301 are distributed to each of the photoelectric conversion units 101. A photoelectric conversion unit 101, transfer transistor, and amplifying transistor make up one pixel in the present embodiment.

The substrate 100 includes an active region 110, and an element isolation region 112 defining the active region 110. Distributed to the active region 110 are the photoelectric conversion unit 101, FD portion 103, source region 105, drain region 106, and so forth. The element isolation region 112 is a region electrically isolating adjacent elements. Examples of the element isolation region 112 include shallow trench isolation (STI) structures, LOCal Oxidization of Silicon (LOCOS) structures, EN-junction and isolation structures.

FIG. 6 further illustrates the outer edge of the incident face 303 of the waveguide 301, and the outer edge of the exit face 302 of the waveguide 301. The area of the exit face 302 is smaller than the area of the incident face 303 in planar view, which can be seen in FIG. 6. The incident face 303 also encompasses the exit face 302 in planar view. This configuration enables incident light to the waveguide 301 to be efficiently guided to the photoelectric conversion unit 101. For example, part of the waveguide 301 covers the wiring 251a, wiring 261a, and wiring 261b. Accordingly, reflection of light entering this portion by the wiring 251a, wiring 261a, or wiring 261b is reduced. As a result, the amount of light entering the photoelectric conversion unit 101 can be increased. Another part of the waveguide 301 also covers the element isolation region 112 adjacent to the photoelectric conversion unit 101. Accordingly, light incident to the element isolation region 112 is guided to the photoelectric conversion unit 101. As a result, the amount of light entering the photoelectric conversion unit 101 can be increased.

FIG. 6 illustrates a waveguide 301 having the circular planar shape the same as in the third embodiment. However, the waveguide 301 according to the first embodiment that is illustrated in FIGS. 1A through 1C, or the waveguide 301 according to the second embodiment that is illustrated in FIGS. 4A through 4C, may be applied to the present embodiment.

The photoelectric conversion device includes the substrate 100, the wiring structure portion 200 disposed on the substrate 100, and the optical unit 400 disposed on the wiring structure portion 200, as illustrated in FIGS. 7A and 7B. Note that only the linking portion 407 of the optical unit 400 is illustrated in FIGS. 7A and 7B, and the other portions of the optical unit 400 have been omitted.

The substrate 100 is a silicon substrate. Other examples of the substrate 100 include an inorganic semiconductor substrate, organic semiconductor substrate, inorganic photoelectric conversion film, organic photoelectric conversion film, and so forth. The element isolation region 112 is disposed in the substrate 100. Portions of the substrate 100 where the element isolation region 112 is not disposed is the active region 110. The photoelectric conversion unit 101 and FD portion 103 may be disposed at the active region 110, as illustrated in FIGS. 7A and 7B.

The photoelectric conversion unit 101 converts incident light into charges. The photoelectric conversion unit 101 according to the present embodiment is a photodiode. The photoelectric conversion unit 101 has an N-type semiconductor region that makes up a PN junction and stores electrons as signal charges. The photoelectric conversion unit 101 may also include a P-type semiconductor region disposed on the N-type semiconductor region. The light receiving face of the photoelectric conversion unit 101 is an interface between the substrate 100 and an insulation member 201 disposed on the substrate 100. In a case where the P-type semiconductor region is provided, the interface between this P-type semiconductor region and the insulation member 201 makes up the light receiving face. In a case where the P-type semiconductor region is not provided, the interface between the N-type semiconductor region that stores signal charges and the insulation member 201 make up the light receiving face. In a case where holes are used as the signal charges, the N-type and P-type can be inverted. In a case where the substrate 100 used is other than a silicon substrate, the interface between this substrate 100 and the insulation member 201 formed of material that is different from the material of the substrate 100 makes up the light receiving face.

The FD portion 103 is configured of an N-type semiconductor region. The FD portion 103 is connected to the wiring 251b via a contact plug. In a case where holes are used as the signal charges, the FD portion 103 is configured of a P-type semiconductor region.

The wiring structure portion 200 includes insulating members including multiple insulating films 211 through 215 disposed on the substrate 100, the wiring 251a and wiring 251b included in a first wiring layer, and the wiring 261a and wiring 261b included in a second wiring layer.

An insulating film 211, an insulating film 213, and an insulating film 215, are each formed of silicon oxide. That is to say, the composition of the insulating film 211, insulating film 213, and insulating film 215 include at least silicon and oxygen. An insulating film 212 and an insulating film 214 are each formed of silicon nitride, silicon carbide, or silicon carbonitride. That is to say, the composition of the insulating film 212 and insulating film 214 include at silicon and least one element selected from a group including carbon and nitrogen. Thus, according to the present embodiment, the composition of the insulating film 211, insulating film 213, and insulating film 215 differ from the composition of the insulating film 212 and insulating film 214. In other words, multiple insulating films that have different compositions from each other are layered on the substrate 100 alternately. The insulating films 211 through 215 electrically insulate the wiring 251, wiring 261, and substrate 100 from each other.

The insulating film 212 is disposed so as to be in contact with the upper face of the wiring 251 included in the first wiring layer. The insulating film 214 is disposed so as to be in contact with the upper face of the wiring 261 included in the second wiring layer. The insulating film 212 and insulating film 214 may function as diffusion prevention layers for metal contained in the wiring 251 and wiring 261. Specifically, the wiring 251 and wiring 261 contain copper. The insulating film 212 and insulating film 214 contain carbon or nitrogen, as described above. Accordingly, the diffusion coefficient of copper in the insulating film 212 and insulating film 214 is smaller than the diffusion coefficient of copper in the insulating film 211, the insulating film 213, and the insulating film 215. According to this configuration diffusion of metal to the substrate 100 can be reduced, so noise can be reduced. Wiring can also be formed using various metals besides copper, such as gold, aluminum, and so forth. The insulating film 212 and insulating film 214 can be made to function as diffusion prevention layers by appropriately selecting the composition of the insulating film 212 and insulating film 214 in accordance with the type of metal used in the wiring.

The insulating films 211 through 215 are disposed so as to surround the waveguide 301. Specifically, each of the insulating films 211 through 215 is provided with an opening. The opening is situated above the photoelectric conversion unit 101. The waveguide 301 is disposed within the opening. At least part of the refractive index of the waveguide 301 is preferably higher than the refractive index of the insulating films 211 through 215. Light can be made to reflect at the side faces of the waveguide 301 due to this difference in refractive index. As another example, light can be made to reflect at the side faces of the waveguide 301 by providing a reflecting member such as metal or the like at the side faces of the waveguide 301. As a further example, a gap or an air gap may be provided around the waveguide 301. That is to say, the waveguide 301 and the insulating films 211 through 215 may be separated from each other.

The waveguide 301 may be formed of a single material. For example, the waveguide 301 may be formed of silicon nitride or organic resin. Alternatively, the waveguide 301 may be formed of multiple layers with different compositions. For example, multiple silicon nitride layers are formed by multiple film formation processes having different conditions from each other. The process conditions differ, so the compositions of the multiple silicon nitride layers may have composition ratios different from each other. As another example, the waveguide 301 includes a liner layer formed of silicon oxide and a core layer formed of silicon nitride. The liner layer is a thin insulating film disposed along the side face of the opening of the insulation member 201. The core layer is an insulating film filling the remaining portion of the opening of the insulation member 201.

The waveguide 301 has a first side face 311, a second side face 312, a third side face 313, a fourth side face 314, and a fifth side face 315 arrayed in that order from the substrate 100. The side faces of the waveguide 301 are, for example, faces of contact between the waveguide 301 and the multiple insulating films 211 through 215. Accordingly, a side face of the waveguide 301 may agree with a side face of an opening. Specifically, in the insulating film 211 is in contact with the first side face 311 of the waveguide 301. In the same way, the insulating films 212 through 215 are respectively in contact with the second side face 312, the third side face 313, the fourth side face 314, and the fifth side face 315, of the waveguide 301.

The first through fifth side faces 311 through 315 each are inclined, as illustrated in FIGS. 7A and 7B. That is to say, the first through fifth side faces 311 through 315 each have an angle of inclination that is greater than 0 degrees. The angle of inclination of a side face of the waveguide 301 is an angle formed between a perpendicular P as to the light receiving face of the photoelectric conversion unit 101, and the side face of the waveguide 301, as described earlier. The perpendicular P as to the light receiving face of the photoelectric conversion unit 101 is illustrated in FIGS. 7A and 7B. That is to say, FIGS. 7A and 7B schematically illustrate cross-sections including the perpendicular P as to the light receiving face of the photoelectric conversion unit 101. The definition of angle of inclination is the same as in the first embodiment. That is to say, the description regarding FIG. 2 in the first embodiment is also applied to the present embodiment.

The angle of inclination of the first side face 311 of the waveguide 301 is smaller than the angle of inclination of the second side face 312 of the waveguide 301, and also is smaller than the angle of inclination of the fourth side face 314 of the waveguide 301, in the present embodiment. The angle of inclination of the third side face 313 of the waveguide 301 is smaller than the angle of inclination of the second side face 312 of the waveguide 301, and also is smaller than the angle of inclination of the fourth side face 314 of the waveguide 301. The angle of inclination of the fifth side face 315 of the waveguide 301 is smaller than the angle of inclination of the second side face 312 of the waveguide 301, and also is smaller than the angle of inclination of the fourth side face 314 of the waveguide 301. That is to say, side faces with a small angle of inclination and side faces with a great angle of inclination are alternately arrayed from the substrate 100.

The incident face 303 of the waveguide 301 can be broadened due to the waveguide 301 having the second side face 312 and fourth side face 314 of which the angles of inclination are great. As a result, a great amount of light can be input to the waveguide. Further, the waveguide 301 has the third side face 313 of which the angle of inclination is small, above the second side face 312, i.e., near the incident face 303. Moreover, the waveguide 301 has the fifth side face 315 of which the angle of inclination is small, above the fourth side face 314, i.e., near the incident face 303. Accordingly, the reflection rate can be raised regarding light reaching the side face of the waveguide 301 near the incident face 303 of the waveguide 301. This configuration consequently enables sensitivity to be improved.

Specific numerical values are not restricted regarding the angles of inclination of the first through fifth side faces 311 through 315. Preferably, the angles of inclination of the first side face 311, third side face 313, and fifth side face 315 are included in a range of 5 degrees to 20 degrees. Preferably, the angles of inclination of the second side face 312 and fourth side face 314 are included in a range of 55 degrees to 85 degrees. The ratio of the incident face 303 and exit face 302, and the height of the waveguide 301, can be designed with a good balance, by including the angle of inclination of each of the side faces in these ranges. Consequently, sensitivity can be improved.

The angles of inclination of the third side face 313 and the fifth side face 315 are preferably smaller than the angle of inclination of the first side face 311. Further, angle of inclination of the fifth side face 315 is preferably smaller than the angle of inclination of the third side face 313. That is to say, the side faces at the portions closer to the incident face 303 of the waveguide 301 preferably are closer to being vertical as to the light receiving face of the photoelectric conversion unit 101. This configuration enables sensitivity to be further improved.

The angle of inclination of the least squares approximation line of the first through fifth side faces 311 through 315 may be greater than 25 degrees in a cross-section including the perpendicular P as to the light receiving face of the photoelectric conversion unit 101. That is to say, even in a case where other elements are distributed on the substrate 100 besides the photoelectric conversion unit 101, light can be efficiently collected to the photoelectric conversion unit 101. The least squares approximation line is calculated by a known technique.

In the present embodiment, the multiple insulating films 211 through 215 are each in contact with the first through fifth side faces 311 through 315. Preferably, the insulating film 211, the insulating film 213, and the insulating film 215 are each thicker than the insulating film 212 and thicker than the insulating film 214. In conjunction with this, the thicknesses of the multiple portions making up the first through fifth side faces 311 through 315 of the waveguide 301 preferably are equal to the respective thicknesses of the multiple insulating films 211 through 215. The height of the waveguide 301 can be increased according to this configuration. As a result, sensitivity can be increased even in a case where a great number of wiring layers are disposed on the substrate 100. Note that in the present specification, the thicknesses of the members and the thicknesses of the films mean the length of the members along the perpendicular P as to the light receiving face of the photoelectric conversion unit 101.

The insulating film 213 preferably is thinner than the insulating film 211. The insulating film 215 preferably is thinner than the insulating film 213. According to this configuration, incident face 303 of the waveguide 301 can be made broader with respect to the exit face 302 of the waveguide 301.

The optical unit 400 according to the present embodiment includes the linking portion 407. The structures illustrated in FIGS. 3A through 3E are used in the optical unit 400 according to the present embodiment. That is to say, the description regarding FIGS. 3A through 3E is all applied to the optical unit 400. Detailed description will be omitted here.

As described above, the waveguide 301 according to the present embodiment has the first through fifth side faces 311 through 315 arrayed in that order from the substrate 100. The side faces having small angles of inclination and the side faces having great angles of inclination are arrayed alternately from the substrate 100. This configuration enables sensitivity to be improved.

Figure 8A:
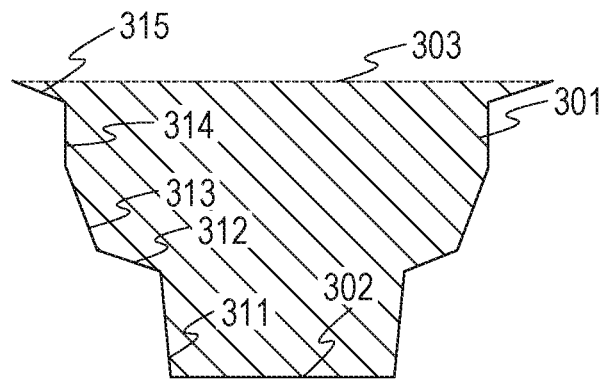
FIGS. 8A and 8B are diagrams schematically illustrating section structures of a photoelectric conversion device.

Note that in a case where the angle of inclination of the first side face 311 is smaller than the angle of inclination of the second side face 312, and the angle of inclination of the third side face 313 is smaller than the angle of inclination of the second side face 312, the angle of inclination of the fourth side face 314 and the angle of inclination of the fifth side face 315 are not restricted in particular. FIG. 8A illustrates such a modification. FIG. 8A schematically illustrates the cross-sectional structure of the waveguide 301 of the photoelectric conversion device. The angle of inclination of the fourth side face 314 may be 10 degrees or smaller, and the fourth side face 314 does not have to be inclined. The angle of inclination of the fifth side face 315 may be greater than the angle of inclination of the third side face 313 and the angle of inclination of the fourth side face 314, or may be 80 degrees or greater, and the fifth side face 315 does not have to be inclined. Advantages of improved sensitivity can be obtained in these cases as well.

Figure 8B:
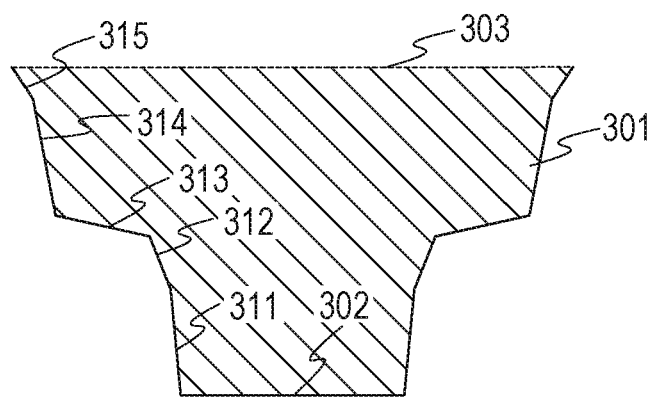

FIG. 8B illustrates yet another modification. The angle of inclination of the third side face 313 is greater than the angles of inclination of the first side face 311, the second side face 312, the fourth side face 314, and the fifth side face 315. For example, the angle of inclination of the third side face 313 is included in a range from 55 degrees to 85 degrees. The angles of inclination of the first side face 311, second side face 312, fourth side face 314, and fifth side face 315, are each included in a range from 5 degrees to 20 degrees. Advantages of improved sensitivity can be obtained in these cases as well.

Fifth Embodiment

Figure 9A:
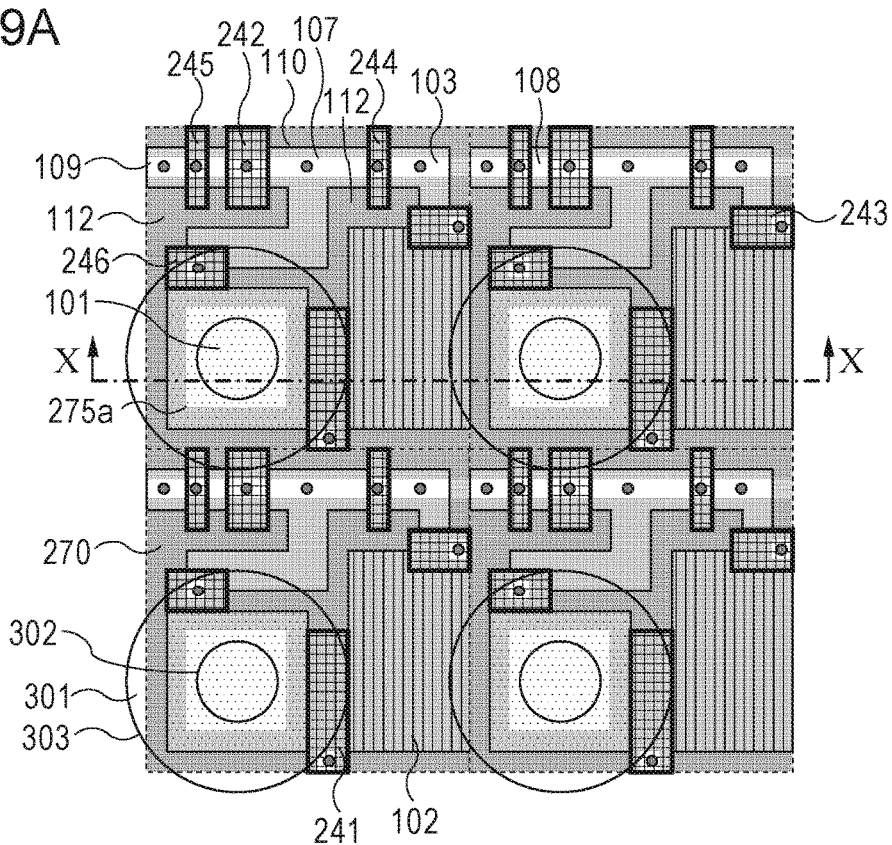
FIGS. 9A and 9B are diagrams schematically illustrating planar structures of a photoelectric conversion device.
Figure 9B:
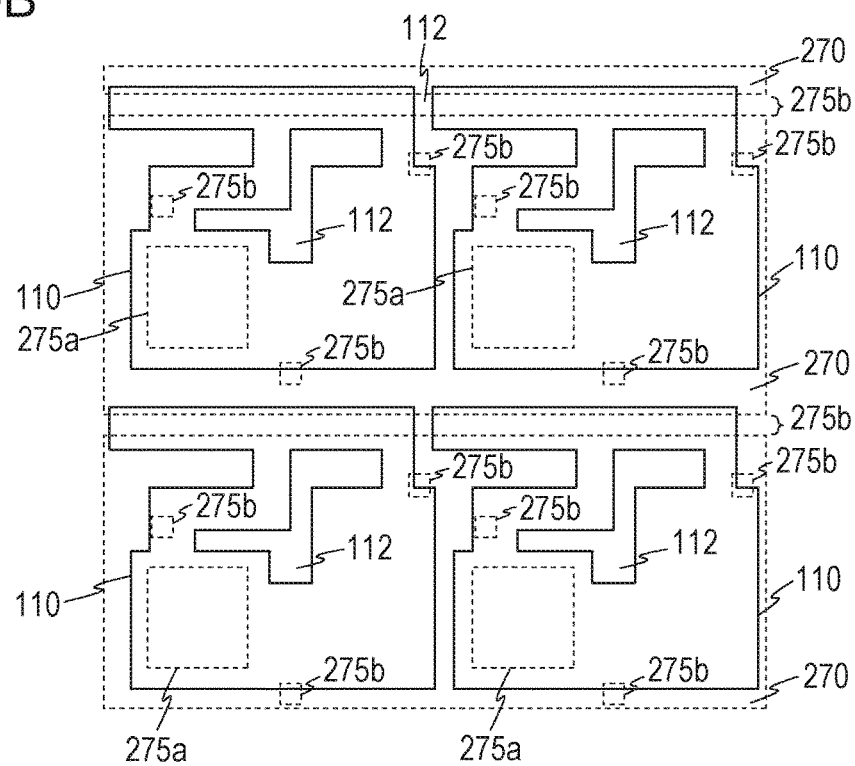
Figure 10:
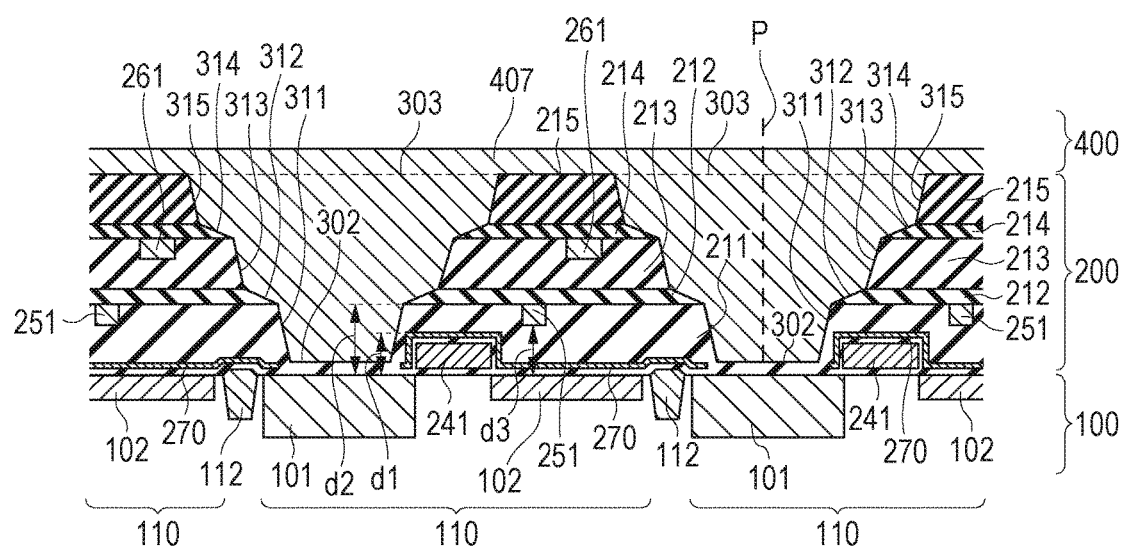
FIG. 10 is a diagram schematically illustrating a section structure of a photoelectric conversion device.

A fifth embodiment will be described. FIGS. 9A and 9B schematically illustrate the planar structure of the photoelectric conversion device according to the fifth embodiment. FIG. 9B is a partial configuration illustrated FIG. 9A that has been extracted for explanation. FIG. 10 schematically illustrates the cross-sectional structure of the photoelectric conversion device taken along X-X in FIG. 9A. Parts that are the same as in FIGS. 1A through 8B are denoted by the same reference numerals. FIGS. 9A and 9B illustrate a layout where the same structures are repeated, so reference symbols are omitted from the repetitive portions.

The photoelectric conversion device according to the present embodiment differs from the photoelectric conversion device according to the first through third embodiments with respect to the point of having other elements disposed on the substrate 100 besides the photoelectric conversion unit 101, and having multiple wiring layers. The photoelectric conversion device according to the present embodiment also differs from the fourth embodiment with regard to the point that it has a charge holding portion 102 that temporarily holds signal charges, and a light shielding portion 270 that shields the charge holding portion 102, besides the photoelectric conversion unit 101 and the FD portion 103. Accordingly, description will be made below primarily regarding portions that differ from the first through fourth embodiments, and description of portions that are the same as in the first through fourth embodiments will be omitted.

The photoelectric conversion device includes the photoelectric conversion unit 101, and the waveguide 301 disposed above the photoelectric conversion unit 101. The waveguide 301 is disposed so as to be overlaid on the photoelectric conversion unit 101 in planar view, as illustrated in FIG. 9A. That is to say, the waveguide 301 is disposed so as to cover the photoelectric conversion unit 101.

The photoelectric conversion device includes the charge holding portion 102 disposed on the substrate 100, and the FD portion 103. The photoelectric conversion device further includes an amplifying transistor, reset transistor, and selection transistor. The transfer gate electrode 241, the amplifying gate electrode 242, a second transfer gate electrode 243, a reset gate electrode 244, a selection gate electrode 245, and a discharge gate electrode 246. No wiring is illustrated in FIG. 9A, for the sake of simplicity. Contact plugs connected to wiring are indicated by small circles in FIG. 9A. No reference numerals are given to denote the contact plugs in FIG. 9A for sake of simplicity.

The substrate 100 includes an active region 110, and an element isolation region 112 defining the active region 110. Distributed to the active region 110 are the photoelectric conversion unit 101, charge holding portion 102, FD portion 103, source regions and drain regions of the transistors, and so forth. The element isolation region 112 is a region electrically isolating adjacent elements. Examples of the element isolation region 112 include STI structures, LOCOS structures, and PN-junction and isolation structures.

The configuration of the photoelectric conversion unit 101 is the same as that of the photoelectric conversion unit 101 according to the first embodiment. Signal charges generated at the photoelectric conversion unit 101 are transferred to the charge holding portion 102 by the transfer gate electrode 241. The signals charges at the charge holding portion 102 are transferred to the FD portion 103 by the second transfer gate electrode 243. The photoelectric conversion unit 101, transfer gate electrode 241, and charge holding portion 102, make up a transfer transistor. The charge holding portion 102, the second transfer gate electrode 243, and the FD portion 103 make up a second transfer transistor. The transfer gate electrode 241 and second transfer gate electrode 243 are each supplied with control signals from wiring omitted from illustration.

The FD portion 103 is connected to the amplifying gate electrode 242 via wiring that is omitted from illustration. The amplifying transistor according to the present embodiment includes the amplifying gate electrode 242, a semiconductor region 107 to which power supply voltage is supplied, and a semiconductor region 108. The semiconductor region 108 serves both as the source region of the amplifying transistor and the drain region of the selection transistor. The selection transistor includes the selection gate electrode 245, semiconductor region 108, and a semiconductor region 109. The semiconductor region 109 making up the drain region of the selection transistor is connected to an output line that is omitted from illustration. According to this configuration, the amplifying transistor can output signals based on signal charges to the output line. That is to say, the amplifying transistor makes up an amplifying unit. The semiconductor regions 107 through 109 in the present embodiment are each N-type semiconductor regions. The FD portion 103 also is made up of an N-type semiconductor region.

The reset transistor includes the reset gate electrode 244, semiconductor region 107 to which power supply voltage is supplied, and the FD portion 103. The semiconductor region 107 serves both as the drain region of the reset transistor and the drain region of the amplifying transistor. Control signals are supplied to the reset gate electrode 244 via wiring that is omitted from illustration. The reset transistor resets the potential of the FD portion 103. The discharge gate electrode 246 discharging signal charges of the photoelectric conversion unit 101 to the semiconductor region 107. That is to say, the semiconductor region 107 also functions as a charge discharging unit. Control signals are supplied to the discharge gate electrode 246 via wiring that is omitted from illustration.

The photoelectric conversion device according to the present embodiment has multiple photoelectric conversion units 101. Each photoelectric conversion unit 101 is provided with a charge holding portion 102, transfer transistor, amplifying transistor, reset transistor, selection transistor, discharge gate electrode 246, and waveguide 301. In the present embodiment, one pixel includes a photoelectric conversion unit 101, charge holding portion 102, transfer transistor, amplifying transistor, reset transistor, selection transistor, and discharge gate electrode 246.

FIG. 9A further illustrates the outer edge of the incident face 303 of the waveguide 301, and the outer edge of the exit face 302 of the waveguide 301. The area of the exit face 302 is smaller than the area of the incident face 303 in planar view, which can be seen in FIG. 9A. The incident face 303 also encompasses the exit face 302 in planar view. This configuration enables incident light to the waveguide 301 to be efficiently guided to the photoelectric conversion unit 101. For example, part of the waveguide 301 covers the element isolation region 112 adjacent to the photoelectric conversion unit 101. Accordingly, incident light onto the element isolation region 112 is guided to the photoelectric conversion unit 101. As a result, the amount of light entering the photoelectric conversion unit 101 can be increased.

As for an example of the size of the waveguide 301, the diameter of the incident face 303 of the waveguide 301 is larger than twice the diameter of the exit face 302 of the waveguide 301. For example, the diameter of the incident face 303 is larger than 2.0 μm. In the other hand, the diameter of the exit face 302 is smaller than. 1.2 μm. According to this configuration, sensitivity can be improved even if the area of the photoelectric conversion unit 101 is reduced due to disposing the charge holding portion 102 on the substrate 100.

FIG. 9A illustrates a waveguide 301 having the circular planar shape the same as in the third embodiment and the fourth embodiment. However, the waveguide 301 according to the first embodiment that s illustrated in FIGS. 1A through 1C, or the waveguide 301 according to the second embodiment that is illustrated in FIGS. 4A through 4C, may be applied to the present embodiment.

The photoelectric conversion device has the light shielding portion 270 disposed above the substrate 100. The light shielding portion 270 covers at least the charge holding portion 102. The light shielding portion 270 covers other elements besides the charge holding portion 102 in the present embodiment. This configuration enables the amount of incident light to the charge holding portion 102 to be reduced. As a result, noise can be reduced.

The waveguide 301 covers the light shielding portion 270 as illustrated in FIG. 9A. Particularly, the waveguide 301 covers the portion of the light shielding portion 270 that covers the charge holding portion 102. The light shielding portion 270 has an opening 275a provided above the photoelectric conversion unit 101. In planar view, the exit face 302 of the waveguide 301 is encompassed by the opening 275a. According to this configuration, incident light to the light shielding portion 270 is guided to the photoelectric conversion unit 101. The amount of incident light reflected by the light shielding portion 270 is reduced, so consequently, sensitivity can be improved.

FIG. 9B schematically illustrates the planar structure of the active region 110, element isolation region 112, and light shielding portion 270. Parts that are the same as those in FIG. 9A are denoted by the same reference numerals. Multiple openings 275 are provided in the light shielding portion 270. The opening 275a is disposed above the photoelectric conversion unit 101. Accordingly, light enters the photoelectric conversion unit 101 via the opening 275a. An opening 275b is provided for disposing a contact plug.

Next, the cross-sectional structure of the photoelectric conversion device according to the present embodiment will be described. FIG. 10 schematically illustrates the cross-sectional structure of the photoelectric conversion device. The photoelectric conversion device includes the substrate 100, the wiring structure portion 200 disposed on the substrate 100, and the optical unit 400 disposed on the wiring structure portion 200, as illustrated in FIG. 10. Note that only the linking portion 407 of the optical unit 400 is illustrated in FIG. 10, and the other portions of the optical unit 400 have been omitted.

The substrate 100 is a silicon substrate. Other examples of the substrate 100 include an inorganic semiconductor substrate, organic semiconductor substrate, inorganic photoelectric conversion film, organic photoelectric conversion film, and so forth. The element isolation region 112 is disposed in the substrate 100. Portions of the substrate 100 where the element isolation region 112 is not disposed is the active region 110. The photoelectric conversion unit 101 and charge holding portion 102 are disposed at the active region 110, as illustrated in FIG. 10.

The photoelectric conversion unit 101 converts incident light into charges. The photoelectric conversion unit 101 according to the present embodiment is a photodiode. The photoelectric conversion unit 101 has an N-type semiconductor region that makes up a PN junction and stores electrons as signal charges. The photoelectric conversion unit 101 may also include a P-type semiconductor region disposed on the N-type semiconductor region. The light receiving face of the photoelectric conversion unit 101 is an interface between the substrate 100 and an insulation member 201 disposed on the substrate 100. In a case where the P-type semiconductor region is provided, the interface between this P-type semiconductor region and the insulation member 201 makes up the light receiving face. In a case where the P-type semiconductor region is not provided, the interface between the N-type semiconductor region that stores signal charges and the insulation member 201 make up the light receiving face. In a case where holes are used as the signal charges, the N-type and P-type can be inverted. In a case where the substrate 100 used is other than a silicon substrate, the interface between this substrate 100 and the insulation member 201 formed of material that is different from the material of the substrate 100 makes up the light receiving face.

The charge holding portion 102 includes an N-type semiconductor region configured to hold signal charges. The charge holding portion 102 may include a P-type semiconductor region disposed upon the N-type semiconductor region. In a case where holes are used as the signal charges, the charge holding portion 102 is configured including a P-type semiconductor region that holds signal charges.

The wiring structure portion 200 includes insulating members including multiple insulating films 211 through 215 disposed on the substrate 100, the wiring 251 included in the first wiring layer, and the wiring 261 included in the second wiring layer. The wiring 251 and wiring 261 are omitted from illustration in FIGS. 9A and 9B.

The insulating film 211, insulating film 213, and insulating film 215, are each formed of silicon oxide. That is to say, the composition of the insulating film 211, insulating film 213, and insulating film 215 include at least silicon and oxygen. The insulating film 212 and insulating film 214 are each formed of silicon nitride, silicon carbide, or silicon carbonitride. That is to say, the composition of the insulating film 212 and insulating film 214 include at silicon and least one element selected from a group including carbon and nitrogen. Thus, according to the present embodiment, the composition of the insulating film 211, insulating film 213, and insulating film 215 differ from the composition of the insulating film 212 and insulating film 214. In other words, multiple insulating films that have different compositions from each other are layered on the substrate 100 alternately. The insulating films 211 through 215 electrically insulate the wiring 251, wiring 261, and substrate 100 from each other.

The insulating film 212 is disposed so as to be in contact with the upper face of the wiring 251 included in the first wiring layer. The insulating film 214 is disposed so as to be in contact with the upper face of the wiring 261 included in the second wiring layer. The insulating film 212 and insulating film 214 may function as diffusion prevention layers for metal contained in the wiring 251 and wiring 261. Specifically, the wiring 251 and wiring 261 contain copper. The insulating film 212 and insulating film 214 contain carbon or nitrogen, as described above. Accordingly, the diffusion coefficient of copper in the insulating film 212 and insulating film 214 is smaller than the diffusion coefficient of copper in the insulating film 211, the insulating film 213, and the insulating film 215. According to this configuration diffusion of metal to the substrate 100 can be reduced, so noise can be reduced. Wiring can also be formed using various metals besides copper, such as gold, aluminum, and so forth. The insulating film 212 and insulating film 214 can be made to function as diffusion prevention layers by appropriately selecting the composition of the insulating film 212 and insulating film 214 in accordance with the type of metal used in the wiring.

The light shielding portion 270 is disposed covering at least the charge holding portion 102. The light shielding portion 270 covers the transfer gate electrode 241, the element isolation region 112, and part of the photoelectric conversion unit 101 in the present embodiment. Part of the insulating film 211 is disposed upon the light shielding portion 270. A separate portion of the insulating film 211 is disposed between the light shielding portion 270 and the substrate 100. The portion of the insulating film 211 that is formed beneath the light shielding portion 270 and the portion formed above the light shielding portion 270 may be formed by separate processes. The portion of the insulating film 211 formed beneath the transfer gate electrode 241 and the portion formed between the transfer gate electrode 241 and the light shielding portion 270 may be formed by separate processes.

The light shielding portion 270 is formed of metal such as tungsten or the like, for example. Alternatively, the light shielding portion 270 is formed of a resin with a low transmission rate of light. The transmission rate of the light shielding portion 270 is lower than the transmission rate of the insulating film 211.

A distance d1 from the substrate 100 to the upper face of the light shielding portion 270 is shorter than a distance d3 from the substrate 100 to the wiring 251 included in the first wiring layer. Wiring connected to the FD portion 103 is included in the first wiring layer. That is to say, the distance d1 from the substrate 100 to the upper face of the light shielding portion 270 is shorter than the distance d3 from the substrate 100 to the FD portion 103 that is connected to the wiring 251. The distance from the substrate 100 is distance following the perpendicular P as to the light receiving face of the photoelectric conversion unit 101. According to this configuration, the light shielding portion 270 is disposed near to the charge holding portion 102, so light-shielding capabilities of the light shielding portion 270 can be improved. As a result, noise can be reduced.

The insulating films 211 through 215 are disposed so as to surround the waveguide 301. Specifically, each of the insulating films 211 through 215 is provided with an opening. The opening is situated above the photoelectric conversion unit 101. The waveguide 301 is disposed within the opening. At least part of the refractive index of the waveguide 301 is preferably higher than the refractive index of the insulating films 211 through 215. Light can be made to reflect at the side faces of the waveguide 301 due to this difference in refractive index. As another example, light can be made to reflect at the side faces of the waveguide 301 by providing a reflecting member such as metal or the like at the side faces of the waveguide 301. As a further example, a gap or an air gap may be provided around the waveguide 301. That is to say, the waveguide 301 and the insulating films 211 through 215 may be separated from each other.

The waveguide 301 may be formed of a single material. For example, the waveguide 301 may be formed of silicon nitride or organic resin. Alternatively, the waveguide 301 may be formed of multiple layers with different compositions. For example, multiple silicon nitride layers are formed by multiple film formation processes having different conditions from each other. The process conditions differ, so the compositions of the multiple silicon nitride layers may have composition ratios different from each other. As another example, the waveguide 301 includes a liner layer formed of silicon oxide and a core layer formed of silicon nitride. The liner layer is a thin insulating film disposed along the side face of the opening of the insulation member 201. The core layer is an insulating film filling the remaining portion of the opening of the insulation member 201.

The waveguide 301 has a first side face 311, a second side face 312, a third side face 313, a fourth side face 314, and a fifth side face 315 arrayed in that order from the substrate 100. The side faces of the waveguide 301 are, for example, faces of contact between the waveguide 301 and one of the multiple insulating films 211 through 215. Accordingly, a side face of the waveguide 301 may agree with a side face of an opening. Specifically, in the insulating film 211 is in contact with the first side face 311 of the waveguide 301. In the same way, the insulating films 212 through 215 are respectively in contact with the second side face 312, the third side face 313, the fourth side face 314, and the fifth side face 315, of the waveguide 301.

The first through fifth side faces 311 through 315 each are inclined, as illustrated in FIG. 10. That is to say, the first through fifth side faces 311 through 315 each have an angle of inclination that is greater than 0 degrees. The angle of inclination of a side face of the waveguide 301 is an angle formed between a perpendicular P as to the light receiving face of the photoelectric conversion unit 101, and the side face of the waveguide 301 in the present embodiment. The perpendicular P as to the light receiving face of the photoelectric conversion unit 101 is illustrated in FIG. 10. That is to say, FIG. 10 schematically illustrates cross-sections including the perpendicular P as to the light receiving face of the photoelectric conversion unit 101. The definition of angle of inclination is the same as in the first embodiment. That is to say, the description regarding FIG. 2 in the first embodiment is also applied to the present embodiment.

The angle of inclination of the first side face 311 of the waveguide 301 is smaller than the angle of inclination of the second side face 312 of the waveguide 301, and also is smaller than the angle of inclination of the fourth side face 314 of the waveguide 301, in the present embodiment. The angle of inclination of the third side face 313 of the waveguide 301 is smaller than the angle of inclination of the second side face 312 of the waveguide 301, and also is smaller than the angle of inclination of the fourth side face 314 of the waveguide 301. The angle of inclination of the fifth side face 315 of the waveguide 301 is smaller than the angle of inclination of the second side face 312 of the waveguide 301, and also is smaller than the angle of inclination of the fourth side face 314 of the waveguide 301. That is to say, side faces with a small angle of inclination and side faces with a great angle of inclination are alternately arrayed from the substrate 100.

The incident face 303 of the waveguide 301 can be broadened due to the waveguide 301 having the second side face 312 and fourth side face 314 of which the angles of inclination are great. As a result, a great amount of light can be input to the waveguide. Further, the waveguide 301 has the third side face 313 of which the angle of inclination is small, above the second side face 312, i.e., near the incident face 303. Moreover, the waveguide 301 has the fifth side face 315 of which the angle of inclination is small, above the fourth side face 314, i.e., near the incident face 303. Accordingly, the reflection rate can be raised regarding light reaching the side face of the waveguide 301 near the incident face 303 of the waveguide 301. This configuration consequently enables sensitivity to be improved.

Next, the relationship between the waveguide 301 and the light shielding portion 270 will be described. The distance d1 from the substrate 100 to the upper face of the light shielding portion 270 is shorter than a distance d2 from the substrate 100 to the boundary between the first side face 311 and second side face 312 of the waveguide 301. The first side face 311 is closest to the substrate 100 out of all the side faces of the waveguide 301. That is to say, when viewed from the substrate 100, the point at which the angle of inclination of the side faces of the waveguide 301 first changes is situated above the light shielding portion 270. In other words, there is no inflection of a side face of the waveguide 301 at the height where the upper face of the light shielding portion 270 is situated.

By using such a structure, a great amount of light can be input to the photoelectric conversion unit 101 by the waveguide 301, even in a case where the area of the light shielding portion 270 covering the charge holding portion 102 is great. For example, in a case where the light shielding portion 270 covers the entirety of the charge holding portion 102, the opening 275a for letting light to the photoelectric conversion unit 101 becomes relatively small. Accordingly, the area of the exit face 302 of the waveguide 301 also becomes small. Accordingly, if the light shielding portion 270 is disposed away from the substrate 100, increasing the incident face 303 of the waveguide 301 becomes difficult.

Conversely, the light shielding portion 270 is disposed at the insulating film 211 that is in contact with the first side face 311 in the present embodiment. That is to say, the light shielding portion 270 is disposed near the substrate 100. Accordingly, even if the opening 275a is small, and consequently the exit face 302 of the waveguide 301 is small, the incident face 303 of the waveguide 301 can be made broader. The reason is that the waveguide 301 has the second side face 312 having a large angle of inclination, that has been disposed above the light shielding portion 270. By setting the distance d1 to be smaller than the distance d2, sensitivity can be greatly improved in the photoelectric conversion device having the charge holding portion 102.

According to the present embodiment, the distance between the substrate 100 and the exit face 302 of the waveguide 301 is shorter than the distance d1 from the substrate 100 to the upper face of the light shielding portion 270. According to this configuration, light exiting the waveguide 301 efficiently enters the photoelectric conversion unit 101. As a result, sensitivity can be improved.

Note that the relationship between the distance from the substrate 100 to each part of the waveguide 301 and the distance from the substrate 100 to the upper face of the light shielding portion 270 is not restricted to that in FIG. 10. For example, the exit face 302 of the waveguide 301 may be situated higher than the upper face of the light shielding portion 270.

Specific numerical values are not restricted regarding the angles of inclination of the first through fifth side faces 311 through 315. Preferably, the angles of inclination of the first side face 311, third side face 313, and fifth side face 315 are included in a range of 5 degrees to 20 degrees. Preferably, the angles of inclination of the second side face 312 and fourth side face 314 are included in a range of 55 degrees to 85 degrees. The ratio of the incident face 303 and exit face 302, and the height of the waveguide 301, can be designed with a good balance, by including the angle of inclination of each of the side faces in these ranges. Consequently, sensitivity can be improved.

The angles of inclination of the third side face 313 and the fifth side face 315 are preferably smaller than the angle of inclination of the first side face 311. Further, angle of inclination of the fifth side face 315 is preferably smaller than the angle of inclination of the third side face 313. That is to say, the side faces at the portions closer to the incident face 303 of the waveguide 301 preferably are closer to being vertical as to the light receiving face of the photoelectric conversion unit 101. This configuration enables sensitivity to be further improved.

The angle of inclination of the least squares approximation line of the first through fifth side faces 311 through 315 may be greater than 25 degrees in a cross-section including the perpendicular P as to the light receiving face of the photoelectric conversion unit 101. Even in a case where other elements are distributed on the substrate 100 besides the photoelectric conversion unit 101, light can be efficiently collected to the photoelectric conversion unit 101. Particularly, the area of the photoelectric conversion unit 101 tends to be small in a case where the charge holding portion 102 is disposed on the substrate 100. Accordingly, the angle of inclination of the least squares approximation line preferably is 20 degrees or greater. According to this configuration, the efficiency of collecting light to the photoelectric conversion unit 101 can be improved, so sensitivity can be improved even if the area of the charge holding portion 102 is great. The least squares approximation line is calculated by a known technique.

The portion of the side faces of the waveguide 301 having a relatively great angle of inclination, e.g., the fourth side face 314, is disposed so as to cover at least the charge holding portion 102. According to this configuration, the light receiving face of the waveguide 301 can be broadened to cover the charge holding portion 102. As a result, the amount of light entering the photoelectric conversion unit 101 can be increased.

In the present embodiment, the multiple insulating films 211 through 215 are each in contact with the first through fifth side faces 311 through 315. Preferably, the first insulating film 211, the third insulating film 213, and the fifth insulating film 215 are each thicker than the second insulating film 212 and thicker than the fourth insulating film 214. In conjunction with this, the thicknesses of the multiple portions making up the first through fifth side faces 311 through 315 of the waveguide 301 preferably are equal to the respective thicknesses of the multiple insulating films 211 through 215. The height of the waveguide 301 can be increased according to this configuration. As a result, sensitivity can be increased even in a case where a great number of wiring layers are disposed on the substrate 100. Note that in the present specification, the thicknesses of the members and the thicknesses of the films mean the length of the members along the perpendicular P as to the light receiving face of the photoelectric conversion unit 101.

The insulating film 213 preferably is thinner than the insulating film 211. The insulating film 215 preferably is thinner than the insulating film 213. According to this configuration, the incident face 303 of the waveguide 301 can be made broader with respect to the exit face 302 of the waveguide 301.

The ratio of the sum T1 of the thicknesses of the insulating film 211, insulating film 213, and insulating film 215, and the sum T2 of the thickness of the insulating film 212 and the insulating film 214, preferably is around 10:1 to 4:1. For example, the ratio between T1 and T2 is approximately 9:1. Note however, that the above range may be exceeded to set the ratio appropriately.

The optical unit 400 according to the present embodiment includes the linking portion 407. The structures illustrated in FIGS. 3A through 3E are used in the optical unit 400 according to the present embodiment. That is to say, the description regarding FIGS. 3A through 3E is all applied to the optical unit 400.

The microlens 401 preferably covers the waveguide 301 and at least the portion of the charge holding portion 102 that is covered by the waveguide 301, in the present embodiment. The color filter 403 also preferably covers the waveguide 301 and at least the portion of the charge holding portion 102 that is covered by the waveguide 301.

As described above, the waveguide 301 according to the present embodiment has the first through fifth side faces 311 through 315 arrayed in that order from the substrate 100. The side faces having small angles of inclination and the side faces having great angles of inclination are arrayed alternately from the substrate 100. This configuration enables sensitivity to be improved.

Note that in a case where the angle of inclination of the first side face 311 is smaller than the angle of inclination of the second side face 312, and the angle of inclination of the third side face 313 is smaller than the angle of inclination of the second side face 312, the angle of inclination of the fourth side face 314 and the angle of inclination of the fifth side face 315 are not restricted in particular. FIG. 8A illustrates such a modification. FIG. 8A schematically illustrates the cross-sectional structure of the waveguide 301 of the photoelectric conversion device. The angle of inclination of the fourth side face 314 may be 10 degrees or smaller, and the fourth side face 314 does not have to be inclined. The angle of inclination of the fifth side face 315 may be greater than the angle of inclination of the third side face 313 and the angle of inclination of the fourth side face 314, or may be 80 degrees or greater, and the fifth side face 315 does not have to be inclined. Advantages of improved sensitivity can be obtained in these cases as well.

FIG. 8B illustrates yet another modification. The angle of inclination of the third side face 313 is greater than the angles of inclination of the first side face 311, the second side face 312, the fourth side face 314, and the fifth side face 315. For example, the angle of inclination of the third side face 313 is included in a range from 55 degrees to 85 degrees. The angles of inclination of the first side face 311, second side face 312, fourth side face 314, and fifth side face 315, are each included in a range from 5 degrees to 20 degrees. Advantages of improved sensitivity can be obtained in these cases as well.

Sixth Embodiment

Figure 11A:
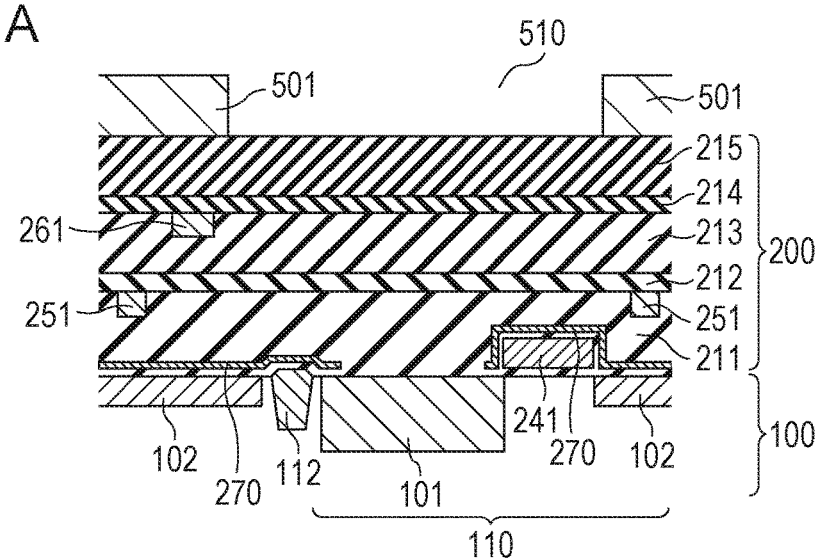
FIGS. 11A through 11C are diagrams schematically illustrating section structures of a photoelectric conversion device.
Figure 11B:
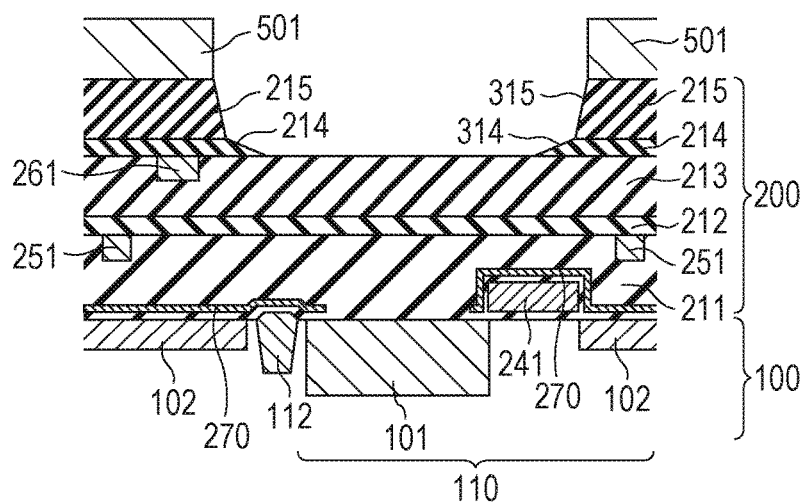
Figure 11C:
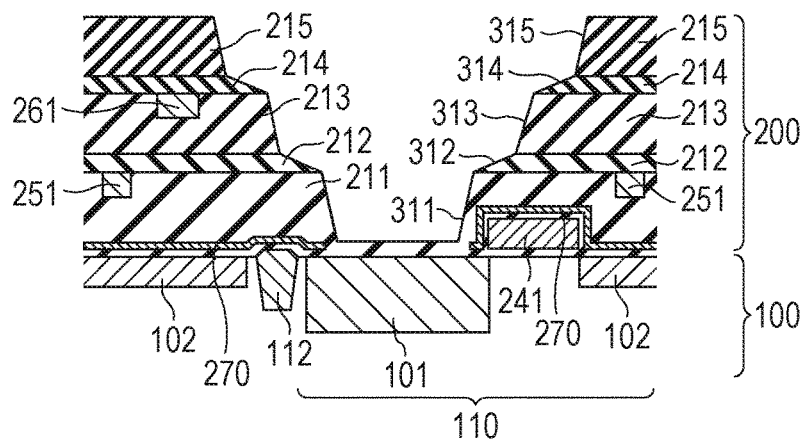

A sixth embodiment will be described. The present embodiment is a manufacturing method of a photoelectric conversion device having the photoelectric conversion unit 101 and the waveguide 301 disposed on the substrate 100. FIGS. 11A through 11C schematically illustrate the cross-sectional structure of the photoelectric conversion device according to the sixth embodiment. FIGS. 11A through 11C illustrate the photoelectric conversion device at different stages of the manufacturing method according to the present embodiment. Parts that are the same in those through FIGS. 1A through 10 are denoted by the same reference numerals.

Elements are formed on the substrate 100, such as the element isolation region 112, the photoelectric conversion unit 101 disposed on the active region 110, the charge holding portion 102, and so forth, as illustrated in FIG. 11A. Thereafter, the transfer gate electrode 241, light shielding portion 270, wiring 251, wiring 261, multiple insulating films 211 through 215, and so forth, are formed. These structures are the same as those described in the first through fifth embodiments. In a case where the wiring 251 and wiring 261 are to be formed of copper, the dual Damascene process is used.

The insulating film 211, insulating film 213, and insulating film 215, are each formed of silicon oxide. That is to say, the composition of the insulating film 211, insulating film 213, and insulating film 215 include at least silicon and oxygen. The insulating film 212 and insulating film 214 are each formed of silicon nitride, silicon carbide, or silicon carbonitride. That is to say, the composition of the insulating film 212 and insulating film 214 include at silicon and least one element selected from a group including carbon and nitrogen. Thus, according to the present embodiment, the composition of the insulating film 211, insulating film 213, and insulating film 215 differ from the composition of the insulating film 212 and insulating film 214. In other words, multiple insulating films that have different compositions from each other are layered on the substrate 100 alternately.

Next, a photoresist pattern 501 is formed on the insulating film 215. The photoresist pattern 501 is formed by performing photolithography of a photoresist film coated on the entire face. The photoresist pattern 501 has an opening 510. The position and shape of the opening 510 decide the position and shape of the waveguide 301. The opening 510 is formed over the photoelectric conversion unit 101, in order to situate the waveguide 301 above the photoelectric conversion unit 101.

The insulating film 215 is etched using the photoresist pattern 501 as a mask, as illustrated in FIG. 11B. Next, the insulating film 214 is etched using the photoresist pattern 501 as a mask.

Plasma etching that uses gas is performed in the present embodiment. Specifically, carbon monoxide is added as a carrier gas to a gas containing fluorine, such as $CF_4$, $CHF_3$, $C_4F_8$, or the like. Performing etching under such conditions enables the fifth side face 315 of the insulating film 215 and the fourth side face 314 of the insulating film 214 to be inclined. The angle of inclination of the fifth side face 315 of the insulating film 215 and angle of inclination of the fourth side face 314 of the insulating film 214 can be controlled by the etching conditions at this time.

First, etching conditions of the insulating film 215 formed of silicon oxide will be described. The chamber pressure is in a range of 100 mTorr to 140 mTorr. The energy applied to the upper electrode to generate plasma is in a range of 1000 W to 1400 W. The energy applied to the lower electrode to generate plasma is in a range of 95 W to 1050 W. The flow rate of gas containing fluorine is in a range of 35 Standard Cubic Centimeters per Minute (SCCM) to 70 SCCM. The flow rate of carbon monoxide is in a range of 400 SCCM to 600 SCCM. Alternatively, it is sufficient for the flow rate of carbon monoxide to be in 35% or more of the total gas flow rate. The angle of inclination of the fifth side face 315 of the insulating film. 215 is within a range of 5 degrees to 20 degrees, by changing the etching conditions within the above-described range.

Examples are as shown below.

In a case where the chamber pressure was 100 mTorr, the upper electrode was 1000 W, the lower electrode was 1000 W, the flow rate of $CF_4$ was 70 SCCM, and the flow rate of carbon monoxide was 500 SCCM, the angle of inclination of the fifth side face 315 of the insulating film 215 was found to be approximately 8 degrees.

In a case where the chamber pressure was 140 mTorr, the upper electrode was 1400 W, the lower electrode was 1000 W, the flow rate of $CF_4$ was 70 SCCM, and the flow rate of carbon monoxide was 500 SCCM, the angle of inclination of the fifth side face 315 of the insulating film 215 was found to be approximately 10 degrees.

In a case where the chamber pressure was 140 mTorr, the upper electrode was 1400 W, the lower electrode was 1000 W, the flow rate of $CHF_3$ was 35 SCCM, and the flow rate of carbon monoxide was 500 SCCM, the angle of inclination of the fifth side face 315 of the insulating film 215 was found to be approximately 13 degrees.

In a case where the chamber pressure was 140 mTorr, the upper electrode was 1400 W, the lower electrode was 1000 W, the flow rate of $CHF_3$ was 70 SCCM, and the flow rate of carbon monoxide was 500 SCCM, the angle of inclination of the fifth side face 315 of the insulating film 215 was found to be approximately 18 degrees.

Under these conditions, the angle of inclination can be increased by making the ratio of $CHF_3$ as to $CF_4$ great. The angle of inclination can also be increased by increasing the chamber pressure and the energy applied to generate plasma.

Next, etching conditions of the insulating film 214 formed of silicon carbide will be described. The chamber pressure is in a range of 100 mTorr to 140 mTorr. The energy applied to the upper electrode to generate plasma is in a range of 1000 N to 1400 W. The energy applied to the lower electrode to generate plasma is in a range of 95 W to 1050 W. The flow rate of gas containing fluorine is in a range of 35 SCCM to 70 SCCM. The flow rate of carbon monoxide is in a range of 400 SCCM to 600 SCCM. Alternatively, it is sufficient for the flow rate of carbon monoxide to be in 35% or more of the total gas flow rate. The angle of inclination of the fourth side face 314 of the insulating film 214 is within a range of 55 degrees to 85 degrees, by changing the etching conditions within the above-described range.

Examples are as shown below.

In a case where the chamber pressure was 100 mTorr, the upper electrode was 1000 W, the lower electrode was 1000 W, the flow rate of $CF_4$ was 70 SCCM, and the flow rate of carbon monoxide was 500 SCCM, the angle of inclination of the fourth side face 314 of the insulating film 214 was found to be approximately 55 degrees.

In a case where the chamber pressure was 140 mTorr, the upper electrode was 1400 W, the lower electrode was 1000 W, the flow rate of $CF_4$ was 70 SCCM, and the flow rate of carbon monoxide was 500 SCCM, the angle of inclination of the fourth side face 314 of the insulating film 214 was found to be approximately 65 degrees.

In a case where the chamber pressure was 140 mTorr, the upper electrode was 1400 W, the lower electrode was 1000 W, the flow rate of $CHF_3$ was 35 SCCM, and the flow rate of carbon monoxide was 500 SCCM, the angle of inclination of the fourth side face 314 of the insulating film 214 was found to be approximately 68 degrees.

In a case where the chamber pressure was 140 mTorr, the upper electrode was 1400 W, the lower electrode was 1000 W, the flow rate of $CHF_3$ was 70 SCCM, and the flow rate of carbon monoxide was 500 SCCM, the angle of inclination of the fourth side face 314 of the insulating film 214 was found to be approximately 78 degrees.

Under these conditions, the angle of inclination can be increased by making the ratio of $CHF_3$ as to $CF_4$ great. The angle of inclination can also be increased by increasing the chamber pressure and the energy applied to generate plasma. The results were generally the same regarding a case where the insulating film 214 was formed of silicon nitride, and a case where the insulating film 214 was formed of silicon carbonitride. Thus, in a case where etching is performed under the same conditions, the angle of inclination of the fourth side face 314 of the insulating film 214 is greater than the angle of inclination of the fifth side face 315 of the insulating film 215. This will be described next.

In parallel with the insulating film 215 or insulating film 214 being etched, by-products are deposited on the side faces of the opening that has been formed, in the etching according to the present embodiment. By-products that have been deposited on the side faces act as masks. As a result, the etching rate differs between the insulating film 215 and the insulating film 214, and as a result, the side face of the opening that has been formed is inclined.

The generated by-products are thought to be deposited on the side face of the opening due to the carbon included in the carbon monoxide used as the carrier gas reacting with the elements included in the material that is the object of etching. Accordingly, the degree of accumulation of the by-products differ in accordance with the difference between the composition of the insulating film 215 and the composition of the insulating film 214. For example, in the case of the insulating film 215 that is formed of silicon oxide, carbon monoxide is generated as a by-product. However, the amount of by-product deposited on the fifth side face 315 of the insulating film 215 is small, due to the high volatility of carbon monoxide. As a result, the angle of inclination of the fifth side face 315 of the insulating film 215 is small. In the case of the insulating film 214 that is formed of silicon carbide, carbon or a compound containing carbon is generated as a by-product. The amount of by-product deposited on the side face 314 of the insulating film 214 is greater, since the volatility of this by-product is lower than that of carbon monoxide. As a result, the angle of inclination of the fourth side face 314 of the insulating film 214 is great.

Thus, an opening having side faces with different angles of inclination can be formed by performing etching under the same conditions, due to the volatility of the by-products being different. The opening having side faces with different angles of inclination can be formed as described above if the flow rate of carbon monoxide, serving as the carrier gas, is 35% or more the total flow rate of gas used for etching. The reason is that physical etching due to carbon monoxide occurs less readily as compared with a case where argon is used as the carrier gas.

Next, the photoresist pattern 501 is used as a mask to etch the insulating film 213, insulating film 212, and insulating film 211, as illustrated in FIG. 11C. The etching here is performed according to the same process as that in FIG. 11B, so description will be omitted.

Thereafter, the waveguide member making up the waveguide 301 is formed at least within the opening. The waveguide 301 is formed by subjecting the waveguide member to processing such as etching, planarizing, and so forth. The optical unit 400 illustrated in FIGS. 3A through 3E is formed above the waveguide 301. The photoelectric conversion device is thus formed by the above processes.

The opening can be formed without changing process conditions according to the method of the present embodiment. Accordingly, the waveguide 301 according to the first through fifth embodiments can be formed by a simpler process.

Seventh Embodiment

Figure 12:
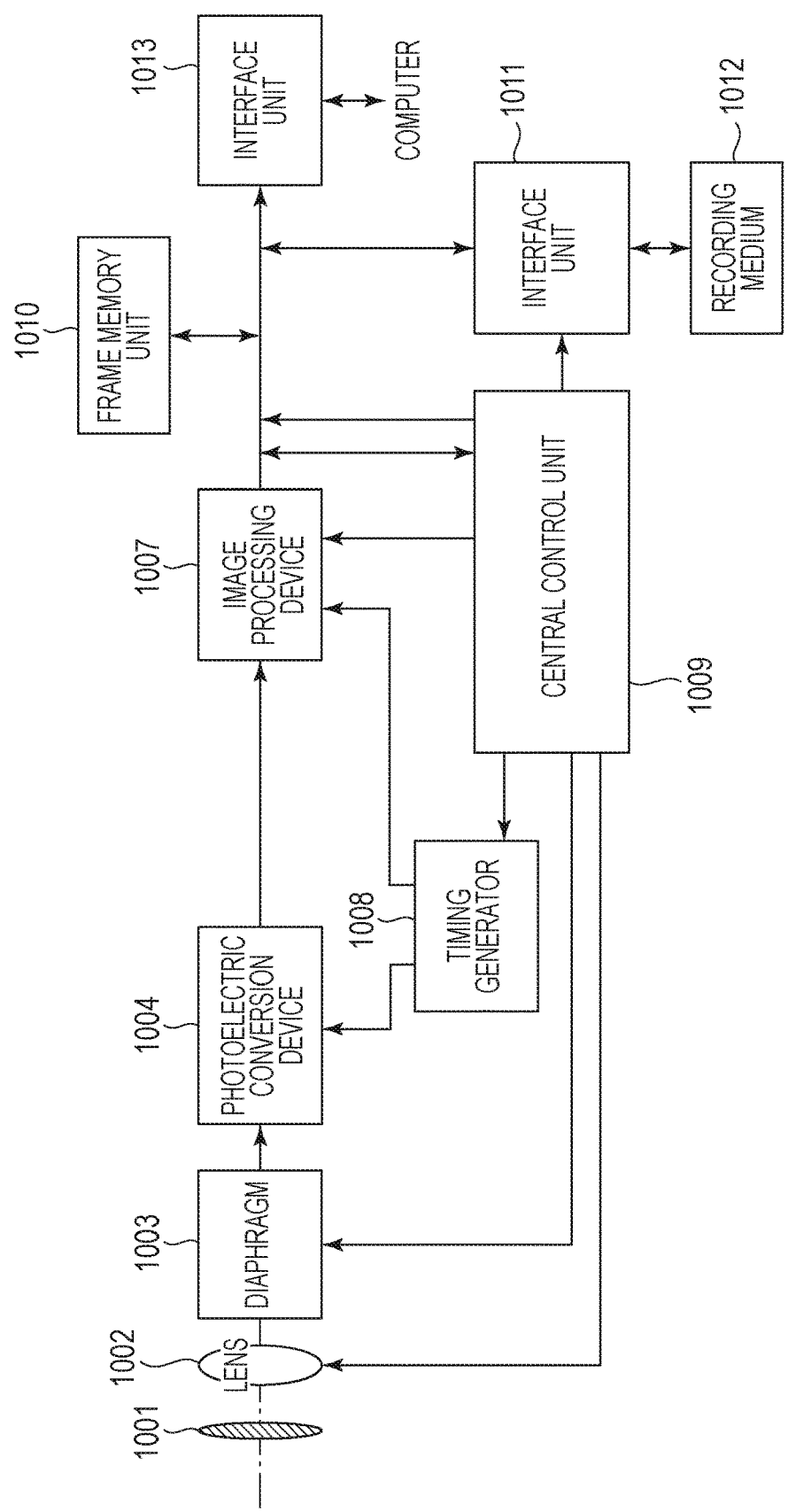
FIG. 12 is a block diagram illustrating an embodiment of an imaging system.

An embodiment of an imaging system will be described. Examples of imaging systems include digital still cameras, digital camcorders, camera heads, copiers, facsimile apparatuses, mobile phones, onboard cameras, observation satellites, and so forth. FIG. 12 illustrates a block diagram of a digital still camera, as an example of an imaging system.

In FIG. 12, reference numeral 1001 denotes a barrier for protecting a lens, 1002 denotes the lens for focusing an optical image of an object on a photoelectric conversion device 1004, and 1003 denotes a diaphragm for changing the amount of light passing through the lens 1002. Reference numeral 1004 is the photoelectric conversion device described in the above embodiments, and converts optical images focused by the lens 1002 into electric signals. An AD conversion unit is formed on the substrate of the photoelectric conversion device 1004. Reference numeral 1007 denotes an image processing device that subjects signals output from the photoelectric conversion device 1004 to various types of correction, data compression, and so forth, thereby acquiring image signals. Reference numeral 1008 in FIG. 12 denotes a timing generator that outputs various types of timing signals to the photoelectric conversion device 1004 and the image processing device 1007, and 1009 denotes a central control unit that controls the entire digital still camera. Reference numeral 1010 denotes a frame memory unit for temporarily storing image data, 1011 denotes an interface unit for recording and reading to and from a recording medium, and 1012 denotes a detachably mounted recording medium, such as semiconductor memory or the like, for recording and reading photography data. Reference numeral 1013 is an interface unit for communicating with an external computer or the like. Note that timing signals may be externally input from outside of the imaging system. It is sufficient for the imaging system to have the photoelectric conversion device 1004, and the image processing device 1007 that processes imaging signals output from the photoelectric conversion device 1004.

A configuration has been described in the present embodiment where the photoelectric conversion device 1004 and the AD conversion unit are formed on the same substrate. However, the photoelectric conversion device 1004 and the AD conversion unit may be formed on different substrates. Further, the photoelectric conversion device 1004 and the image processing device 1007 may be formed on the same substrate.

Also, each pixel may be configured including a first photoelectric conversion unit and a second photoelectric conversion unit. The image processing device 1007 may be configured to process signals based on charges generated at the first photoelectric conversion unit and signals based on charges generated at the second photoelectric conversion unit, and acquire distance information from the photoelectric conversion device 1004 to an object.

Eighth Embodiment

Figure 13A:
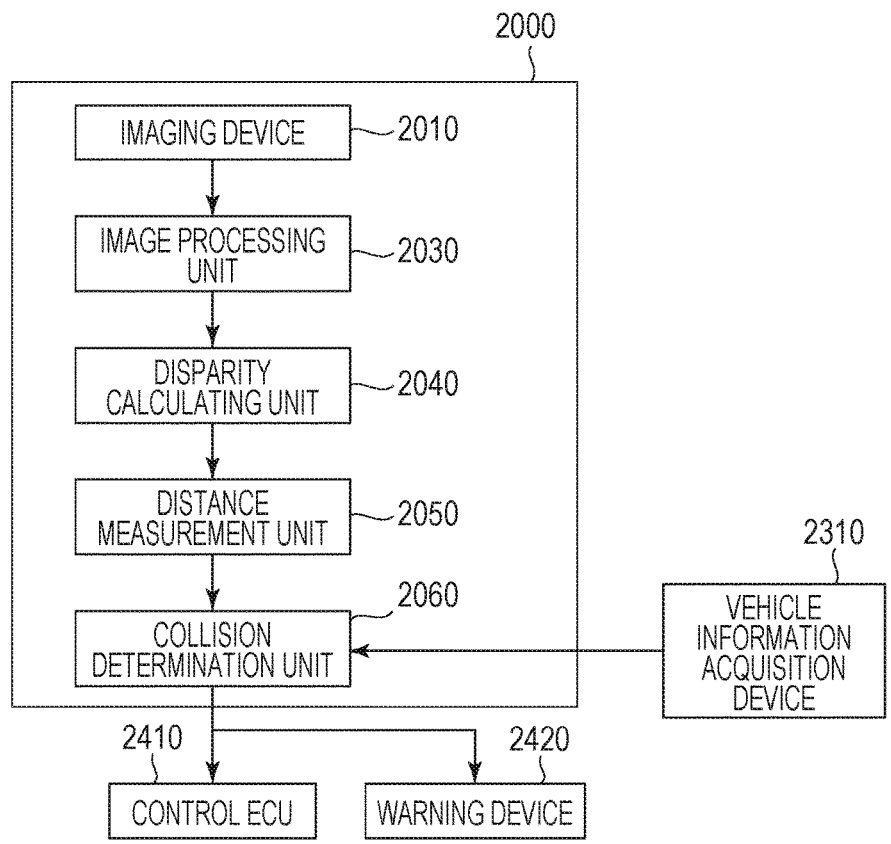
FIGS. 13A and 13B are block diagrams of an embodiment of a movable apparatus.

FIG. 13A illustrates an example of an imaging system relating to an onboard camera. An imaging system 2000 has a photoelectric conversion device 2010, that is the photoelectric conversion device according to the embodiments described above. The imaging system 2000 has an image processing unit 2030 that performs image processing on multiple sets of image data acquired by the photoelectric conversion device 2010, and a disparity calculating unit 2040 that calculates disparity (phase difference between disparity images) form multiple sets of image data acquired by the imaging system 2000. The imaging system 2000 also has a distance measurement unit 2050 that calculates distance to an object based on the calculated disparity, and a collision determination unit 2060 that determines whether or not there is possibility of a collision, based on the calculated distance. The disparity calculating unit 2040 and the distance measurement unit 2050 are examples of a distance information acquisition unit that acquires distance information to an object. That is to say, distance information is information relating to disparity, defocusing value, distance to an object, and so forth. The collision determination unit 2060 may use any of these sorts of distance information to determine the possibility of a collision. The distance information acquisition unit may be realized by purpose-designed hardware, by a software module, by a field programmable gate array (FPGA) or an application specific integrated circuit (ASIC) or the like, of by a combination thereof.

The imaging system 2000 is connected to a vehicle information acquisition device 2310, and can acquire vehicle information such as vehicular speed, yaw rate, steering angle, and so forth. Connected to the imaging system 2000 is a control electronic control unit (ECU) 2410 that is a control device outputting control signals generating braking power for the vehicle, based on the determination results at the collision determination unit 2060. The imaging system 2000 is also connected to a warning device 2420 that issues a warning to the driver, based on the determination results at the collision determination unit 2060. For example, in a case where the collision determination unit 2060 determines that there is a high possibility of collision, vehicle control to avoid collision or to reduce damage is performed by the control ECU 2410, such as braking, reducing the accelerator, suppressing engine output, or the like. The warning device 2420 warns the user by sounding a warning by sound or the like, displaying warning information on a screen of an automotive navigation system, applies vibrations to the seatbelt or steering wheel, or the like.

Figure 13B:
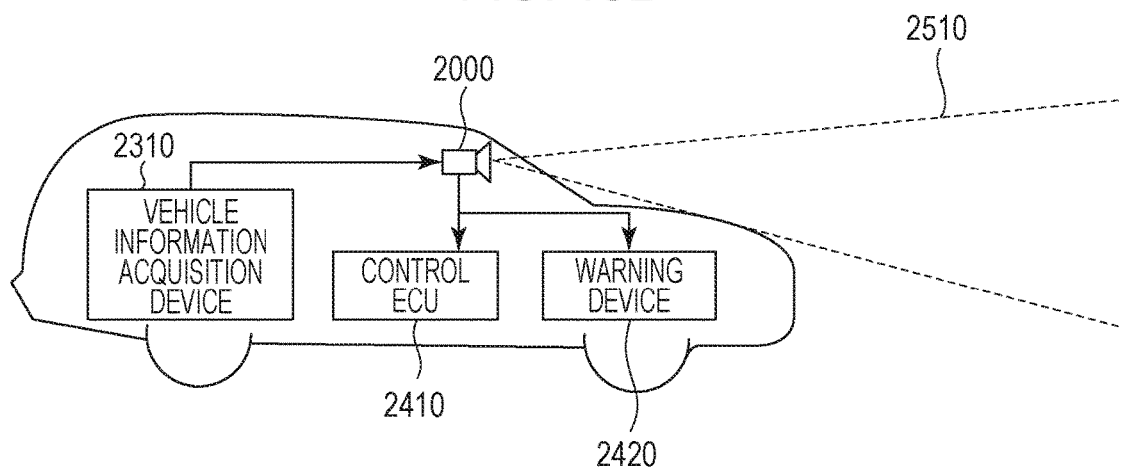

The imaging system 2000 according to the present embodiment images the periphery of the vehicle, such as ahead of or behind the vehicle, for example. FIG. 13B illustrates an imaging system in a case of imaging ahead of the vehicle. Although an example has been described above of control to avoid collision with another vehicle, this is also applicable to control where a vehicle performs automatic driving following another vehicle, or to control where a vehicle performs automatic driving staying in a lane. Further, the imaging system is not restricted to vehicles such as automobiles and so forth, and can be applied to movable bodies (movable devices) including, for example, ships, aircraft, industrial robots, and so forth. Additionally, the imaging system is not restricted to movable bodies, and is broadly applicable to device using object recognition, such as intelligent transport systems (ITS) and so forth.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-134446 filed. Jul. 6, 2016, which is hereby incorporated by reference herein in its entirety.

What is claimed is:

1. A photoelectric conversion device comprising:
   a photoelectric conversion unit disposed in a substrate;
   a waveguide member disposed above the photoelectric conversion unit; and
   an insulating member disposed above the substrate, and surrounding at least part of the waveguide member,
   wherein the waveguide member has a first side face, a second side face, and a third side face, arranged in that order from the substrate,
   wherein each of the first side face, the second side face and the third side face is inclined with respect to a line perpendicular to a light receiving face of the photoelectric conversion unit,
   wherein an angle of inclination of the second side face is smaller than 90 degrees,
   wherein the angle of inclination of the first side face is smaller than the angle of inclination of the second side face, and
   wherein the angle of inclination of the third side face is smaller than the angle of inclination of the second side face.

2. The photoelectric conversion device according to claim 1,
   wherein the insulating member includes a first insulating film in contact with the first side face, a second insulating film in contact with the second side face, and a third insulating film in contact with the third side face, and wherein a composition of the second insulating film is different from a composition of the first insulating film, and is different from a composition of the third insulating film.

3. The photoelectric conversion device according to claim 2, further comprising:
a wiring disposed above the substrate,
wherein the second insulating film is disposed in contact with an upper face of the wiring.

4. The photoelectric conversion device according to claim 3,
wherein the first insulating film is thicker than the second insulating film, and
wherein the third insulating film is thicker than the second insulating film.

5. The photoelectric conversion device according to claim 4,
wherein the wiring includes a metal, and
wherein a diffusion coefficient of the metal in the second insulating film is smaller than a diffusion coefficient of the metal in the first insulating film and a diffusion coefficient of the metal in the third insulating film respectively.

6. The photoelectric conversion device according to claim 5,
wherein the composition of the first insulating film contains silicon and oxygen,
wherein the composition of the second insulating film contains silicon and at least one element selected from a group including carbon and nitrogen, and
wherein the composition of the third insulating film contains silicon and oxygen.

7. The photoelectric conversion device according to claim 6,
wherein the waveguide member covers at least part of the wiring.

8. The photoelectric conversion device according to claim 1, further comprising:
a plurality of pixels,
wherein each of the plurality of pixels includes the photoelectric conversion unit, a floating diffusion portion configured to receive charges generated at the photoelectric conversion unit, an amplifying unit connected to the floating diffusion portion, and a charge holding portion configured to hold the charges at a different portion from the photoelectric conversion unit and the floating diffusion portion.

9. The photoelectric conversion device according to claim 8,
wherein the waveguide member covers at least part of the charge holding portion.

10. The photoelectric conversion device according to claim 8, further comprising:
a light shielding portion configured to cover the charge holding portion,
wherein the waveguide member covers at least partially the light shielding portion.

11. The photoelectric conversion device according to claim 10,
wherein the waveguide member covers part of the light shielding portion, the part of the light shielding portion covering the charge holding portion.

12. The photoelectric conversion device according to claim 10,
wherein a first distance from the substrate to an upper face of the light shielding portion is shorter than a distance from the substrate to a boundary between the first side face and the second side face.

13. The photoelectric conversion device according to claim 12, further comprising:
a wiring disposed above the substrate and connected to the floating diffusion portion,
wherein the first distance is shorter than a third distance from the substrate to the wiring.

14. The photoelectric conversion device according to claim 13,
wherein the second distance is longer than the third distance.

15. The photoelectric conversion device according to claim 14,
wherein the insulating member includes a first insulating film in contact with the first side face, a second insulating film in contact with the second side face, and a third insulating film in contact with the third side face, and
wherein the second insulating film is disposed in contact with an upper face of the wiring.

16. The photoelectric conversion device according to claim 15,
wherein the first insulating film is thicker than the second insulating film, and
wherein the third insulating film is thicker than the second insulating film.

17. The photoelectric conversion device according to claim 16,
wherein the wiring includes a metal,
wherein a composition of the second insulating film is different from a composition of the first insulating film and is different from a composition of the third insulating film, and
wherein a diffusion coefficient of the metal in the second insulating film is smaller than a diffusion coefficient of the metal in the first insulating film and a diffusion coefficient of the metal in the third insulating film respectively.

18. The photoelectric conversion device according to claim 17, further comprising:
a microlens covering at least part of the waveguide member and charge holding portion.

19. The photoelectric conversion device according to claim 18, further comprising:
a color filter disposed between the substrate and the microlens; and
a planarization layer disposed between the color filter and the microlens,
wherein the color filter covers at least part of the waveguide member and the charge holding portion.

20. The photoelectric conversion device according to claim 1,
wherein a thickness of a first portion forming the first side face of the waveguide member is greater than a thickness of a second portion forming the second side face of the waveguide member, and
wherein a thickness of a third portion forming the third side face of the waveguide member is greater than the thickness of the second portion.

21. The photoelectric conversion device according to claim 1,
wherein the angle of inclination of the first side face is greater than the angle of inclination of the third side face.

22. The photoelectric conversion device according to claim 1,
wherein the angle of inclination of the first side face is included in a range from 5 degrees to 20 degrees,
wherein the angle of inclination of the second side face is included in a range from 55 degrees to 85 degrees, and
wherein the angle of inclination of the third side face is included in a range from 5 degrees to 20 degrees.

23. The photoelectric conversion device according to claim 1,
wherein the waveguide member has a fourth side face,
wherein the first side face, the second side face, the third side face, and the fourth side face, are arranged from the substrate in that order, and
wherein the angle of inclination of the third side face is smaller than an angle of inclination of the fourth side face.

24. The photoelectric conversion device according to claim 23,
wherein the waveguide member has a fifth side face,
wherein the first side face, the second side face, the third side face, the fourth side face, and the fifth side face, are arranged from the substrate in that order, and
wherein an angle of inclination of the fifth side face is smaller than the angle of inclination of the fourth side face.

25. The photoelectric conversion device according to claim 24,
wherein the angle of inclination of the first side face is greater than the angle of inclination of the third side face,
and wherein the angle of inclination of the third side face is greater than the angle of inclination of the fifth side face.

26. The photoelectric conversion device according to claim 1,
wherein an angle of inclination of a least squares approximation line calculated for the first side face, the second side face, and the third side face, is 20 degrees or greater than 20 degrees.

27. The photoelectric conversion device according to claim 26,
wherein the angle of inclination of the least squares approximation line is 25 degrees or greater 25 degrees.

28. A photoelectric conversion device comprising:
a photoelectric conversion unit disposed in a substrate;
an insulating member disposed above the substrate, and having an opening at a position corresponding to the photoelectric conversion unit; and
a waveguide member disposed above the photoelectric conversion unit and within the opening,
wherein the opening has a first side face, a second side face, and a third side face, arranged in that order from the substrate,
wherein each of the first side face, the second side face and the third side face is inclined with respect to a line perpendicular to a light receiving face of the photoelectric conversion unit,
wherein an angle of inclination of the second side face is smaller than 90 degrees,
wherein an angle of inclination of the first side face is smaller than the angle of inclination of the second side face, and
wherein an angle of inclination of the third side face is smaller than the angle of inclination of the second side face.

29. The photoelectric conversion device according to claim 28,
wherein the insulating member includes a first insulating film forming the first side face of the opening, a second insulating film forming the second side face, and a third insulating film forming the third side face, and
wherein a composition of the second insulating film is different from a composition of the first insulating film, and is different from a composition of the third insulating film.

30. An imaging system comprising:
the photoelectric conversion device according to claim 1; and
a processing device configured to acquire image signals by processing signals from the photoelectric conversion device.

31. An imaging system comprising:
the photoelectric conversion device according to claim 28; and
a processing device configured to acquire image signals by processing signals from the photoelectric conversion device.

32. A movable apparatus, comprising:
the photoelectric conversion device according to claim 1;
a processing device configured to process an image signal based on signals from the photoelectric conversion device; and
a control unit configured to control the movable apparatus based on a result of the processing.

33. A movable apparatus, comprising:
the photoelectric conversion device according to claim 28;
a processing device configured to process an image signal based on signals from the photoelectric conversion device; and
a control unit configured to control the movable apparatus based on a result of the processing.

34. A manufacturing method of a photoelectric conversion device, the method comprising:
forming an insulating member including a first insulating film, a second insulating film and a third insulating film, which are arranged on a substrate including a photoelectric conversion unit in that order from the substrate;
forming an opening in the insulating member, at a position corresponding to the photoelectric conversion unit; and
forming a waveguide member in the opening,
wherein, in the opening, an angle of inclination of a first side face provided by the first insulating film is smaller than an angle of inclination of a second side face provided by the second insulating film,
wherein, in the opening, an angle of inclination of third side face provided by the third insulating film is smaller than the angle of inclination of the second side face, and
wherein, in the opening, the angle of inclination of the second side face is smaller than 90 degrees, and
wherein each of the first side face, the second side face and the third side face is inclined with respect to a line perpendicular to a light receiving face of the photoelectric conversion unit.

35. The manufacturing method of a photoelectric conversion device according to claim 34,
wherein a composition of the second insulating film is different from a composition of the first insulating film, and is different from a composition of the third insulating film, and wherein the forming of the opening includes etching, which is performed under a same condition for the first insulating film, the second insulating film, and the third insulating film.

36. The manufacturing method of a photoelectric conversion device according to claim 35,
wherein the forming of the opening is performed by plasma etching using gas including carbon monoxide.

37. The manufacturing method of a photoelectric conversion device according to claim 36,
wherein a flow rate of carbon monoxide in the gas is 35% or more of the total flow rate.

38. The manufacturing method of a photoelectric conversion device according to claim 34,
wherein, in the forming of the opening, etching of the insulating member is performed in parallel with deposition of a by-product to a side face at a part of the opening that has been formed,
wherein volatility of a first by-product generated when etching the first insulating film is higher than volatility of a second by-product generated when etching the second insulating film, and
wherein volatility of a third by-product generated when etching the third insulating film is higher than the volatility of the second by-product.

* * * * *